(12) United States Patent
Klein et al.

(10) Patent No.: US 8,270,131 B2
(45) Date of Patent: Sep. 18, 2012

(54) ELECTROSTATIC DISCHARGE PROTECTION ELEMENT AND ELECTROSTATIC DISCHARGE PROTECTION CHIP AND METHOD OF PRODUCING THE SAME

(75) Inventors: Wolfgang Klein, Zorneding (DE); Hans Taddiken, Munich (DE); Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 390 days.

(21) Appl. No.: 12/533,919

(22) Filed: Jul. 31, 2009

(65) Prior Publication Data
US 2011/0026174 A1   Feb. 3, 2011

(51) Int. Cl.
*H02H 9/00* (2006.01)
(52) U.S. Cl. ......... 361/56; 361/91.1; 361/111; 257/355; 257/656; 257/544
(58) Field of Classification Search ............. 361/56, 361/91.1, 111; 257/355, 656, 450, 544–550, 257/927, 929, E31.061
See application file for complete search history.

(56) References Cited

U.S. PATENT DOCUMENTS

| | | | |
|---|---|---|---|
| 3,398,334 A | 8/1968 | Shockley | |
| 4,149,174 A | 4/1979 | Shannon | |
| 5,475,341 A * | 12/1995 | Reed | 327/566 |
| 6,665,802 B1 | 12/2003 | Ober | |
| 7,218,492 B2 * | 5/2007 | Shrier | 361/56 |
| 7,564,103 B2 * | 7/2009 | Losehand et al. | 257/376 |
| 7,638,370 B2 * | 12/2009 | Gossner et al. | 438/135 |
| 7,838,939 B2 * | 11/2010 | Russ et al. | 257/355 |
| 7,919,816 B2 * | 4/2011 | Gossner et al. | 257/355 |
| 2009/0140388 A1 | 6/2009 | Joos et al. | |

FOREIGN PATENT DOCUMENTS

| | | |
|---|---|---|
| DE | 10 2005 049 247 A1 | 10/2005 |
| EP | 0 106 254 A2 | 4/1984 |
| EP | 0 598 146 A1 | 5/1994 |
| EP | 1 542 287 A1 | 6/2005 |

OTHER PUBLICATIONS

Urresti, J., et al., "Lateral punch-through TVS devices for on-chip protection in low-voltage applications," Microelectronics Reliability, vol. 45, 2005, pp. 1181-1186, Elsevier Ltd.
European Search Report, European Patent Application No. 10170011.0-1528, Applicant: Infineon Technologies AG, Dated: Oct. 28, 2010, 7 pages.

* cited by examiner

*Primary Examiner* — Patrick Salce
(74) *Attorney, Agent, or Firm* — Slater & Matsil, L.L.P.

(57) ABSTRACT

An electrostatic discharge (ESD) protection element is described, the ESD protection element including a collector area, a first barrier area, a semiconductor area, a second barrier area and an emitter area. The collector area has a first conductivity type. The first barrier area borders on the collector area and has a second conductivity type. The semiconductor area borders on the first barrier area and is an intrinsic semiconductor area, or has the first or second conductivity type and a dopant concentration which is lower than a dopant concentration of the first barrier area. The second barrier area borders on the semiconductor area and has the second conductivity type and a higher dopant concentration than the semiconductor area. The emitter area borders on the second barrier area and has the first conductivity type.

16 Claims, 19 Drawing Sheets

ELECTROSTATIC DISCHARGE PROTECTION ELEMENT AND ELECTROSTATIC DISCHARGE PROTECTION CHIP AND METHOD OF PRODUCING THE SAME

TECHNICAL FIELD

Embodiments of the present invention relate to semiconductor electrostatic discharge (ESD) protection elements and electrostatic discharge protection chips, for example, for the ESD protection of data lines and antennas. The invention furthermore relates to methods of producing the semiconductor electrostatic discharge protection elements and electrostatic discharge protection chips.

BACKGROUND

Electrostatic discharges may cause permanent damage to electronic circuits. Semiconductor integrated circuits are particularly susceptible to electrostatic discharge. Therefore, protection elements or structures are required to protect, for example, analog or digital data lines of semiconductor integrated circuits. The ideal electrostatic discharge protection element immediately shunts any voltage which has a magnitude above a predefined critical threshold, and does not affect the characteristics of the data line during normal operation, i.e., for voltages below the threshold value. General objects of a design for electrostatic discharge devices are: keeping the peak voltage at the beginning of an electrostatic discharge occurrence or pulse at a minimum; keeping the degradation for a large number of electrostatic discharge occurrences at a minimum to ensure a long product life time; and providing a high insulation for low frequencies during normal operation.

Known protection elements are, for example, polymer protection elements or high quality coils. The polymer protection elements and the coils show a high peak voltage in case of electrostatic discharges. In addition, the polymer protection elements show degradation after many electrostatic discharge pulses and the coils show a poor isolation at low frequencies, i.e., a certain conductivity at low frequencies against ground during normal operation.

BRIEF DESCRIPTION OF THE DRAWINGS

Embodiments of the present invention are described hereinafter, making reference to the appended drawings.

Figure 1A:
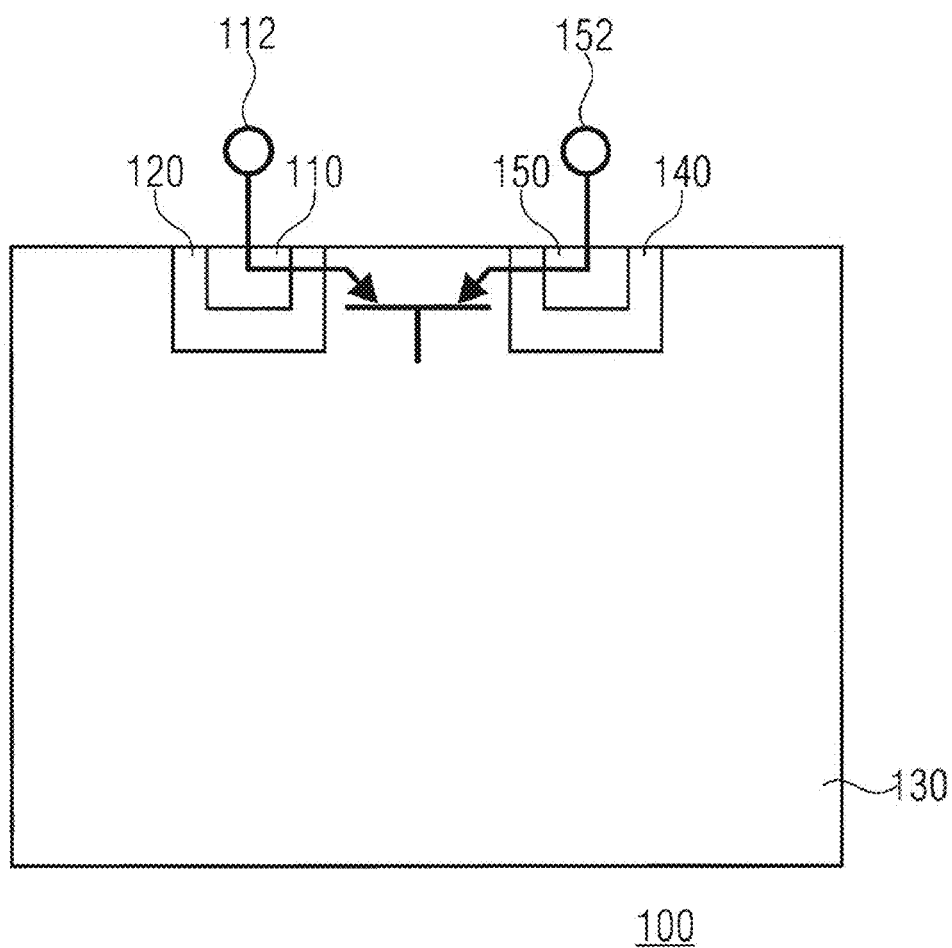
FIG. 1A shows a cross-sectional view of a transistor-based embodiment of an electrostatic discharge element with a lateral transistor structure.

Equal or equivalent elements or elements with equal or equivalent functionality are denoted in the following description by equal or equivalent reference numerals.

DETAILED DESCRIPTION OF ILLUSTRATIVE EMBODIMENTS

FIG. 1A shows a cross-sectional view of a first transistor based embodiment of an electrostatic discharge protection element with a lateral transistor structure (see laterally oriented transistor symbol in FIG. 1A with collector contact 112 and emitter contact 152). The electrostatic discharging protection element 100 comprises a collector area 110, a first barrier area 120, a semiconductor area 130, a second barrier area 140, and an emitter area 150. In FIG. 1A, the semiconductor area 130 can also be referred to as a substrate, wherein the collector area 110 borders on the first barrier area 120, the semiconductor area borders on the first barrier area, the second barrier area borders on the semiconductor area 130, and the emitter area 150 borders on the second barrier area 140.

In FIG. 1A, the collector area 110 and the first barrier area 120 are formed by a double well structure implanted into the semiconductor area, wherein the outer well of the double well structure forms the first barrier area 120, which surrounds the inner well forming the collector area 110. Similarly, the emitter area 150 and the second barrier area 140 are formed by a second double well structure implanted into the semiconductor area or substrate 130, wherein the outer well of the second double well forms the second barrier area 140 surrounding the emitter area 150. In other words, FIG. 1A shows an embodiment, wherein the collector area 110 and the emitter area 150 are both arranged at the top surface of the semiconductor area or substrate 130 and are fully embedded in the first barrier area 120 and, the second barrier area 140, respectively.

Details on the dimensions and doping concentrations of the different areas and the ESD protection mechanism are later described based on FIGS. 2A and 2B.

Figure 1B:
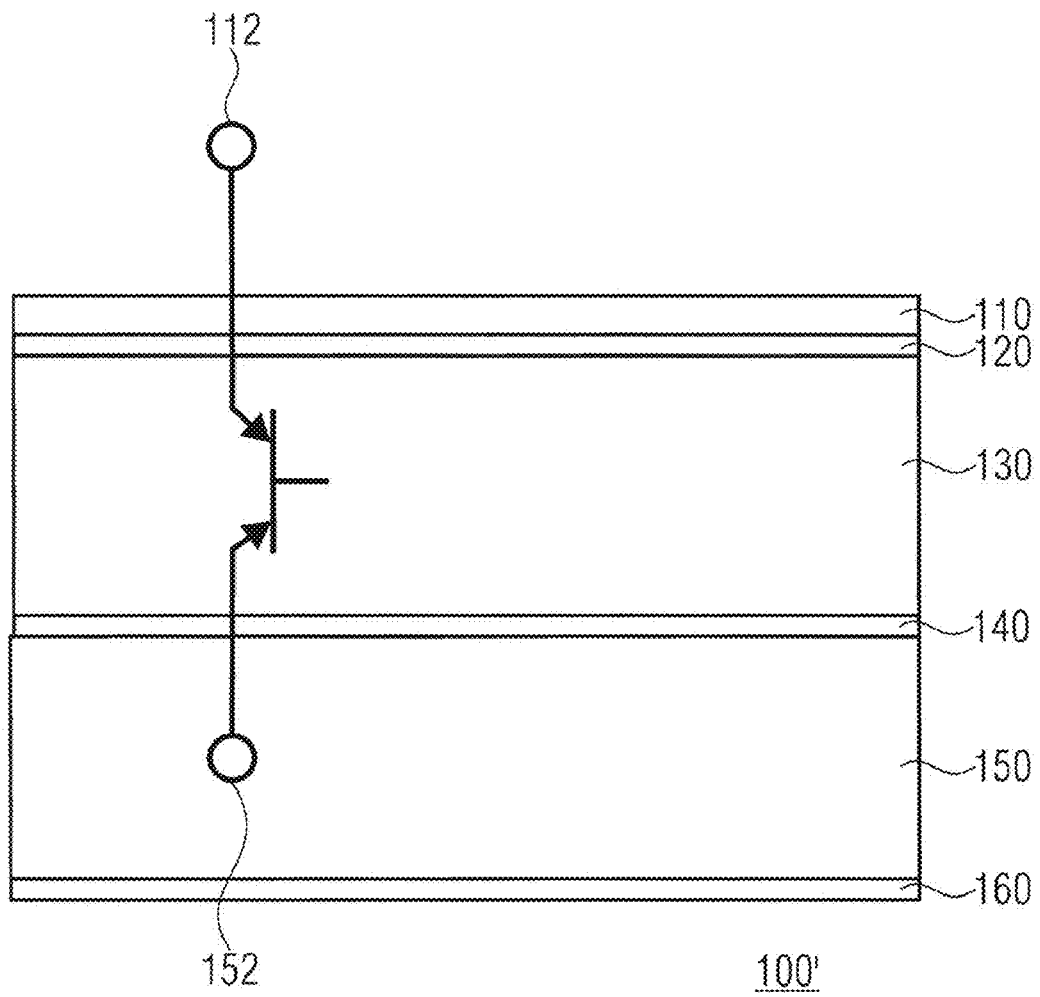
FIG. 1B shows a cross-sectional view of a second transistor-based embodiment of an electrostatic discharge protection element with a vertical transistor structure.

FIG. 1B shows a cross-sectional view of a transistor-based embodiment of an electrostatic discharge protection element 100' with a vertical transistor structure (see vertically oriented transistor symbol in FIG. 1B with collector contact 112 and emitter contact 152). As in FIG. 1A, the electrostatic discharging protection element 100' comprises a collector area 110, a first barrier area 120, a semiconductor area 130, a second barrier area 140, and an emitter area 150, wherein the collector area 110 borders on the first barrier area 120, the semiconductor area borders on the first barrier area, the second barrier area borders on the semiconductor area 130, and the emitter area 150 borders on the second barrier area 140.

In contrast to FIG. 1A, the collector area 110, the first barrier area 120, the semiconductor area 130, the second barrier area 140, and the emitter area 150, are not arranged in a lateral order but in a vertical order, wherein each area is formed by a horizontal layer, and wherein the second barrier area 140 is arranged on top of the emitter area 150, the semiconductor area 130 is arranged on top of the second barrier area 140, wherein the first barrier area 120 is arranged on top of (according to the orientation of FIG. 1B) the semiconductor area 130, and wherein the collector area 110 is arranged on top of the first barrier area 120 (formed as horizontal layers, as shown in FIG. 1B). Furthermore, in FIG. 1A the semiconductor area 130 can be referred to as a substrate, whereas in FIG. 1B the emitter area 150 can be referred to as a substrate with contact layer 160.

The contact layer or backside contact 160 below the emitter area 150 is optional, borders on the emitter area and can be used to electrically connect the emitter area 150.

Figure 2A:
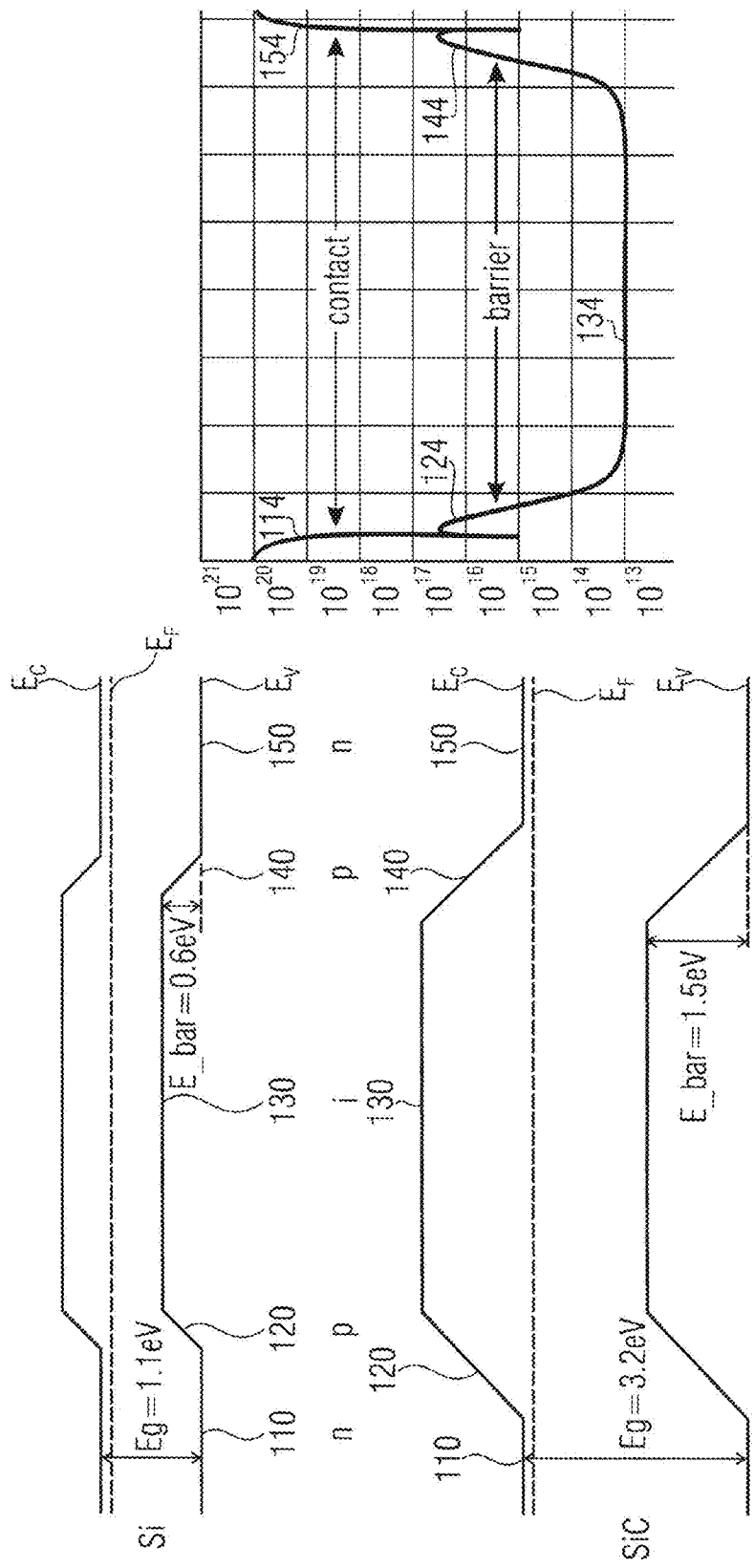
FIG. 2A shows on the right hand side an example of a dopant profile for embodiments of the electrostatic discharge protection element according to FIGS. 1A and 1B with an npipn transistor structure, and on the left hand side the corresponding diagrams of energy band structures for Si and SiC as semiconductor material.

FIG. 2A shows on the right hand side thereof, an example of a dopant profile of an electrostatic discharge protection element according to FIG. 1A (lateral transistor structure) or FIG. 1B (vertical transistor structure). The ordinate shows the dopant concentration of donors or acceptors per cm$^3$, whereas the abscissa shows the spatial extension (horizontal extension for FIG. 1A and vertical extension for FIG. 1B). The dopant profile shows the conductivity types and the dopant concentrations starting from the collector area 110 (left) to the emitter area 150 (right).

The collector area 110 has a first conductivity type, the first barrier area 120 has a second conductivity type, the semiconductor area 130 is an intrinsic semiconductor area or a semiconductor area having the first or second conductivity type, the second barrier area 140 has a second conductivity type and the emitter area 150 has a first conductivity type. The second conductivity type is different to the first conductivity type, or in other words, the second conductivity type is the inverse conductivity type to the first conductivity type.

Reference numeral 114 refers to a first part of the dopant profile, the dopant concentration of the collector area 110, reference sign 124 refers to a second part of the dopant profile, the dopant concentration of the first barrier area 120, reference sign 134 refers to a third part of the dopant profile, the dopant concentration of the intrinsic or lightly doped semiconductor area 130, reference sign 144 to a fourth part of the dopant profile, the dopant concentration of the second barrier area 140, and reference sign 154 to a fifth part of the dopant profile, the dopant concentration of the emitter area 150. As can be seen from this diagram, the average dopant concentration of the collector area 110 and the emitter area 150 is more than 100 times higher than the dopant concentration of the respective barrier areas 120 and 140, on which they border, and the average dopant concentration of the first barrier area 120 and the second barrier area 140 are at least 100 times higher than the average dopant concentration of the semiconductor area 130. In other words, FIG. 2A shows a dopant profile and respective band energy profiles for an electrostatic discharge protection element with an n$^+$pipn$^+$transistor structure, or short npipn transistor structure, wherein a first conductivity type is realized by an n-doping and a second conductivity type is realized by a p-doping. As the transistor structure is electrically connected via the collector area 110 and the emitter area 150, these areas can also be referred to as contact areas (see arrows "contact" in FIG. 2A for indicating the distance between the two contact areas). The second arrow "barrier" in FIG. 2A indicates the distance between the first barrier and the second barrier area.

On the left hand side of FIG. 2A, the band energy profiles for silicon Si (see top left area of FIG. 2A) and silicon carbide SiC (see bottom left area of FIG. 2A), resulting from the npipn dopant profiles shown on the right hand side, are depicted. In both band energy profiles, the Fermi level $E_F$, the profile of the energy $E_C$ of the conducting band and the profile of the energy of the valence band $E_V$ are depicted, as well as the bandgap energy Eg for the respective semiconductor material and the energy barrier E_bar are shown. The bandgap between the valence band and the conduction band, or to be more precise, the energy difference Eg between the energy level of the upper border of the valence band and the energy level of the lower border of the conduction band, is specific to each semiconductor material, e.g., for silicon Si Eg=1.1 eV and for silicon carbide SiC Eg=3.2 eV at room temperature (see FIG. 2A). The intrinsic carrier density $n_i$, also referred to as intrinsic charge carrier density, describes the carrier density of electrons and holes of an intrinsic, i.e., undoped or nearly undoped, semiconductor material. As the creation of electron-hole pairs depends on the semiconductor material specific bandgap energy Eg, also the intrinsic carrier density $n_i$ is semiconductor material specific, e.g., for Si: $n_i \approx 1.5 \cdot 10^{10}$ cm$^{-3}$ at room temperature. For semiconductor materials doped with dopant atoms, i.e., donors or acceptors, $N_A$ is used for the dopant concentration of acceptors within a p-doped area of the semiconductor material and $N_D$ for the dopant concentration of donors within an n-doped area of the semiconductor material. The intrinsic difference of the voltage potentials at the pn-junction, also referred to as diffusion voltage $V_D$ or as built-in potential $V_{BI}$, is specified by the following equation:

$$V_{BI} = \frac{k \cdot T}{e} \cdot \ln \frac{N_A \cdot N_D}{n_i^2}, \quad (1)$$

wherein T specifies the temperature in K, e specifies the elementary charge and k is the Boltzman constant. Thus, the higher the dopant concentrations with donors $N_D$ and acceptors $N_A$, the higher becomes the built-in voltage $V_{BI}$. Furthermore the smaller the intrinsic carrier density $n_i$, i.e., the larger the bandgap energy Eg, the higher the built-in voltage $V_{BI}$. The built-in voltage $V_{BI}$ also occurs between higher and lower doped areas of the same dopant type. At the pn-junction a depletion zone, also referred to as charge carrier zone, is built up due to the built-in voltage $V_{BI}$. The width W of the depletion zone is specified by the following equation:

$$W = \sqrt{\frac{2 \cdot \varepsilon}{e} \cdot (V_{BI} - V) \cdot \left(\frac{1}{N_A} + \frac{1}{N_D}\right)}, \quad (2)$$

wherein $\varepsilon$ is the dielectric constant and V an external voltage applied at the p-doped area and the n-doped area of the pn-semiconductor structure.

With no external voltage V applied to the pn-semiconductor structure, or in other words to the pn-junction, the width W of the depletion zone depends on the built-in voltage $V_{BI}$ and the dopant concentrations of the acceptors $N_A$ and the donors $N_D$. The higher the built-in voltage $V_{BI}$ of the doped semiconductor material, the larger the depletion zone width W, and the larger the dopant concentrations $N_A$ and $N_D$, the smaller the depletion zone width W, wherein the smaller of both dominates the effect of the dopant concentrations on the depletion zone width. In case an external voltage V is applied in forward direction to the pn-junction, the width W becomes smaller, and in case an external voltage is applied in backward or reverse direction, the width W of the depletion zone becomes larger.

In case the dopant concentrations $N_A$ and $N_D$ are equal, the depletion zone extends with W/2 from the junction into the p-doped zone and into the n-doped zone. In case the dopant concentrations are not equal, the depletion zone extends more to the zone with the lower dopant concentration, as can be seen from the following equations:

$$W_p = W \cdot \frac{N_D}{N_D + N_A} \quad (3)$$

and $$W_n = W \cdot \frac{N_A}{N_D + N_A} \quad (4)$$

wherein $W_p$ is the width of the depletion zone width extending into the p-doped zone and wherein $W_n$ is the width of the depletion zone width extending into the n-doped zone.

The energy barriers E_bar shown in FIG. 2A are caused by the built-in voltage $V_{BI}$ and are defined by the following equation:

$$E\_bar = e \cdot V_{BI}. \quad (5)$$

The energy barriers E_bar represent a barrier, e.g., electrons have to overcome to move from, e.g., the collector area 110 to the emitter area 150, or vice versa.

The energy band profile on the top left corner of FIG. 2A for Si shows the bandgap value Eg=1.1 eV of Si and the energy value E_bar=0.6 eV caused by the built-in voltage $V_{BI}$ of Si, respectively the depletion zone. Due to the reverse conductivity types, a barrier for the electrons of the collector area 110 and the emitter area 150 are formed, blocking the electron flow from collector area 110 to the emitter area 150, and vice-versa. The areas 110 to 150 according to FIGS. 1A, 1B, 2A and 2B are symmetrically structured with regard to the middle of the semiconductor area. The first and second barrier areas 120, 140 have the same width and the same dopant concentration, and the collector area 110 and the emitter area 150 have the same, or almost the same, dopant concentration. Thus, the same blocking characteristics are achieved for both directions, collector to emitter and vice versa. Due to the large difference of the dopant concentrations of the collector area 110 and the emitter area 150 with about $10^{20}$ per $cm^3$, compared to the bordering barrier areas 120, 140, with an $N_D$ of about $10^{16}$-$10^{17}$ per $cm^3$, the depletion zone almost completely extends into the barrier areas, whereas the part of the depletion zone extending into the collector area 110 and the emitter area 150 can be neglected (see equation (2) above). The energy level of the barrier E_bar, i.e., the energy that the electrons have to overcome to pass the barrier, can be calculated according to equations (5) and (1), and is about 0.6 eV at room temperature and about 1.5 eV for SiC at room temperature.

As can be seen from equation (2), SiC not only shows a higher built-in voltage $V_{BI}$ (equation (1)), and thus, energy barrier (see equation (5)), but also a larger depletion zone width W for the same doping ($N_A$, $N_D$) at the pn-junction compared to Silicon, due to its larger bandgap Eg. Thus, a SiC pn-junction provides a better insulation or barrier compared to Si pn-junction with the same doping profile.

In other words, to achieve the same depletion zone width, the dopant concentration of the p-zone and the n-zone of a pn-junction based on SiC is higher than for Si. As more dopant atoms are ionized for SiC within the same depletion zone width W, the electric field within the depletion zone and, thus, the built-in voltage $V_{BI}$ is higher than for Si. The higher the built-in voltage, the higher are the external voltages that can be blocked by the pn-junction.

Therefore, embodiments of the npipn transistor structure with SiC as semiconductor material for the transistor structure provide a higher blocking voltage in the forward direction of the pn-junctions than embodiments using Si as semiconductor material.

Furthermore, due to its higher bandgap energy E_gap, pn-junctions made of SiC also provide a higher blocking voltage in the backward direction, as the energy required to start a charge carrier avalanche is also higher.

Embodiments of the electrostatic discharge protection element 100 block any positive or negative voltage applied to the collector and emitter areas, which is below its breakdown voltage, wherein embodiments with semiconductor materials having a higher energy band gap Eg have higher breakdown voltages than embodiments with semiconductor materials having lower energy band gaps Eg.

The dopant concentration of the first barrier area 120 and the second barrier area 140 of embodiments of the electrostatic discharge protection element 100 are chosen such that the two barrier areas are essentially depleted from charge carriers of the second conductivity type when no external voltage is applied to the electrostatic discharge protection element 100.

Thus, by choosing the appropriate semiconductor material, and the appropriate dimensions and dopant concentrations for the collector area, the emitter area and depending on the aforementioned aspects, also the appropriate dimensions and dopant concentrations for the first barrier area, the second barrier area and the semiconductor area, a flexible concept for implementing passive electrostatic discharge protection elements for a large variety of different threshold voltages is provided.

The term passive is to be understood such that no or a negligible amount of power is consumed during normal operation, i.e., when the voltages applied to the collector and emitter areas of the electrostatic discharge protection element are below the threshold or blocking voltage, wherein the threshold voltage is the voltage at which the electrostatic discharge protection element changes from a blocking state to a conducting state to shunt the electrostatic discharge pulse to ground.

With electrostatic discharge protection elements according to FIGS. 1A and 2A and/or dimensions and dopant concentrations for the different areas 110 to 150 as described herein, blocking voltages of magnitudes of, for example, 4 Volts can be achieved based on Si substrates, whereas blocking voltages of magnitudes of, for example, about 40 Volts can be achieved using SiC as substrate material, with no need for any bias voltages.

The advantage of embodiments of electrostatic discharge protection elements based on Si substrates is the possibility of integrating these protection elements in larger integrated circuits or chips, comprising further functionality.

However, as explained before, the blocking voltages that can be achieved based on Si substrates without external blocking or reverse bias voltages applied at a base area of the transistor structure are not sufficient for, e.g., high frequency signals with high amplitudes, for example, high frequency signals near to or at antennas of mobile phones, where positive and negative amplitudes of several tens of Volts have to be blocked for normal operation. According to IEC 61000-4-2, e.g., for mobile phones high frequency signals with amplitudes of about +/−40 Volts have to be blocked by the electrostatic discharge protection elements during normal operation with an inter-modulation of −107 dBc, wherein the supply voltage provided by the battery of the mobile phone is only about 3 Volts.

Therefore, embodiments of the electrostatic discharge protection elements with SiC as semiconductor material or any other semiconductor material with large bandgap, e.g., GaN and Diamond, can be used to provide blocking voltages of +/−40V as required for the above mentioned mobile phone ESD applications. As the circuitry that is to be protected from ESD pulses is typically implemented on integrated circuits with Si as semiconductor material, the electrostatic discharge protection elements with SiC as semiconductor material can, for example, be provided as discrete devices or chips that are connected via external contacts to the Si based circuitry that is to be ESD protected.

Embodiments according to FIGS. 1A and 1B have no base contact or area to contact the base directly to an external voltage. In other words, the embodiments according to FIGS. 1A and 1B have a floating base.

In certain embodiments with lateral transistor structures according to FIG. 1A, the lateral width of the first barrier area 120 and the second barrier area 140 can lie within a range of 0.05 µm to 2 µm and in further embodiments within a range of 0.2 µm and 1 µm. The lateral width of the semiconductor area 130 between the two barrier areas 120 and 140, i.e., the lateral distance between the two barrier areas 120 and 140, can lie within a range of 0.3 µm to 10 µm, and in further embodiments, e.g., within a range of 5 µm to 8 µm.

In certain embodiments with vertical transistor structures according to FIG. 1B, the vertical width or thickness of the first barrier area 120 and the second barrier area 140 can lie within a range of 0.05 µm to 2 µm and in specific embodiments within a range of 0.2 µm to 1 µm. The vertical width or thickness of the semiconductor area between the two barrier areas 120, 140 can lie within a range of 0.3 µm to 10 µm, and in particular embodiments within a range from 5 µm to 8 µm.

For both kinds of embodiments (FIGS. 1A and 1B) the dopant concentration of the collector area 110 and the emitter area 150 can be at least $10^{18}$ dopant atoms, i.e., donor or acceptor atoms, per $cm^3$, and in particular embodiments, at least $10^{19}$ dopant atoms per $cm^3$. The dopant concentration of the first barrier area 120 and the second barrier area 140 can lie within a range of $10^{15}$-$10^{18}$ dopant atoms per $cm^3$ and more specifically within a range $10^{16}$-$10^{17}$ dopant atoms per $cm^3$. The dopant concentration of the semiconductor area 130 is at maximum $10^{15}$ dopant atoms per $cm^3$, and can also be zero or close to zero.

In certain embodiments, see FIG. 2A, the dopant concentration of the first barrier area 120 and the second barrier area 140 is at least 50 times higher than the dopant concentration of the semiconductor area 130, and the dopant concentration of the collector area 110 and the emitter area 150 is at least 100 times higher than the dopant concentration of the barrier area on which they are bordering.

Furthermore, the dopant concentrations of the first barrier area 120 and the second barrier area 140 are chosen such (see equations 1 to 4) that the first barrier area 120 and the second barrier area 140 are at least essentially depleted of charge carriers of the second conductivity type, or in other words, are depleted of their respective majority charge carriers, e.g., depleted from holes for the npipn transistor structure, when no voltage is applied to the electrostatic discharge device.

In further embodiments, additionally the dopant concentration of the semiconductor area 130 is chosen such that the semiconductor area is at least essentially depleted of charge carriers of the second conductivity type, or in other words, is depleted of its respective majority charge carriers, e.g., depleted from holes for the npipn transistor structure, when no voltage is applied to the electrostatic discharge device.

In further embodiments, the dopant concentrations of the first barrier area 120 and the second barrier area 140 and the dopant concentration of the semiconductor area 130 is chosen such that the first barrier area 120, the second barrier area 140 and the semiconductor area 130 is only partially depleted of charge carriers of the second conductivity type, when no voltage is applied to the electrostatic discharge device. This will degrade the linearity of RF signals, but can still be used in digital applications.

In the following, the operation of an electrostatic discharge element according to FIGS. 1A to 2B and further details with regard to the dopant concentration will be explained.

For operation, the emitter area 150 is connected to ground (see reference sign 152), and the collector area 110 is connected to a data line (see reference sign 112) which is to be protected from electrostatic discharges by the protection element 100 or 100'. The electrostatic discharge protection element 100, 100' is designed such that its threshold voltage or breakdown voltage is sufficiently high so as to block any current at normal operating voltages of the signal applied to the data line from flowing from the data line via the collector area, the emitter area to ground, in case of positive signal voltages at the data line, and to block any current from flowing from ground via emitter area, collector area to the data line, in case of negative signal voltages applied to the data line.

The signal values applied to the data line can be analog signals or digital signals. In case of analog signals, and in particular in case of analog high-frequency signals, a high degree of linear behavior of the data lines has to be kept, and furthermore, the generation of harmonics of the signal has to be kept at a minimum, e.g., for UMTS applications. Therefore, in embodiments of the electrostatic discharge protection element 100, 100' for use with such analog high-frequency data lines, the dopant concentration of the first and second barrier areas 120, 140 are defined such that the barrier areas 120, 140 or barrier areas 120, 140 and the semiconductor area 130 are completely depleted from charge carriers of the second conductivity type, when no voltage is applied to the electrostatic discharge device. In further embodiments for such applications, the dopant concentration of the barrier areas 120, 140 will be defined such that even a slightly longer barrier area, e.g., a barrier area with a width that is 5% larger than the actual width of the barrier areas 120, 140, would be depleted (when no voltage is applied to the electrostatic discharge device), to ensure that no charge carriers of the second conductivity type are left within the barrier areas.

For digital signals the requirements for the degree of linear behavior or the requirement for suppression of harmonics of the signal are not that strict as for analog high-frequency signals. Therefore, for embodiments of the electrostatic discharge protection element 100, 100' used for electrostatic discharge protection of digital data lines, a dopant concentration of the barrier areas 120, 140 that causes the barrier areas 120, 140 to be essentially free of charge carriers (when no voltage is applied to the electrostatic discharge device) can be sufficient. The barrier areas are sufficiently free of charge carriers in case 95% of the barrier areas are depleted from majority carriers (holes for the npipn-transistor structures and electrons for pninp-transistor structures). The same applies with regard to the selection of the dopant concentration for the semiconductor area 130.

The term "essentially depleted" in general refers to a depletion of the barrier areas and/or semiconductor area by 95% or more, i.e., describes that at minimum 95% of the majority charge carriers of the respective barrier area or semiconductor area are depleted, that 95% of the donor atoms within the respective barrier area or semiconductor area are ionized, that the depletion zone extends starting from the pn-junction into more than 95% the respective barrier area or semiconductor area bordering on the pn-junction, or that the width of the depletion zone covers 95% of the width of the respective barrier area or semiconductor area.

The term "fully depleted" in general describes that all—under a statistical point of view—majority charge carriers of the respective barrier area and semiconductor area are depleted, that all donor atoms within the respective barrier area or semiconductor area are ionized, that the depletion zone extends starting from the pn-junction over the whole of the respective barrier area or semiconductor area bordering on the pn-junction, or that the width of the depletion zone covers 100% of the width of the respective barrier area or semiconductor area.

The electrostatic protection elements 100, 100', or the other embodiments described in the following, can be integrated into an integrated circuit comprising further digital or analog circuitry, or can be implemented as a discrete device.

For integrated embodiments of the electrostatic discharge protection element 100, the reference sign 112 represents an internal contact or an internal electrical connection line with a low resistance value, e.g., a metallic connection, to a data line integrated in the same semiconductor device or chip that is to be protected from electrostatic discharges by the electrostatic discharge protection element, wherein the data line is, for example, a data line of the above digital or analog circuitry. The reference sign 152 represents an internal contact or internal electrical connection line with low resistance, e.g., also by a metallic conductor, connecting the emitter area 150 with the ground line of the semiconductor device or chip. The ground line is, for example, electrically connected to the ground pad or ground pin of the semiconductor device, by which the semiconductor device or chip can be connected to an external ground voltage.

For discrete embodiments of the electrostatic discharge protection element 100, the reference sign 112 represents an electrical connection line to a data pad or data pin of the electrostatic discharge protection device or chip, or an external data contact itself, e.g., an external data pad or data pin of the chip, by which the chip can be connected to an external data line or data contact, e.g., of a different chip, that is to be protected by the electrostatic discharge protection element 100. The reference sign 152 represents an electrical connection to a ground pad or ground pin of the electrostatic discharge protection device or chip or the external ground contact of the chip itself, i.e., external ground pad or ground pin of the chip, by which the electrostatic discharge protection device or chip can be connected to an external ground.

Figure 2B:
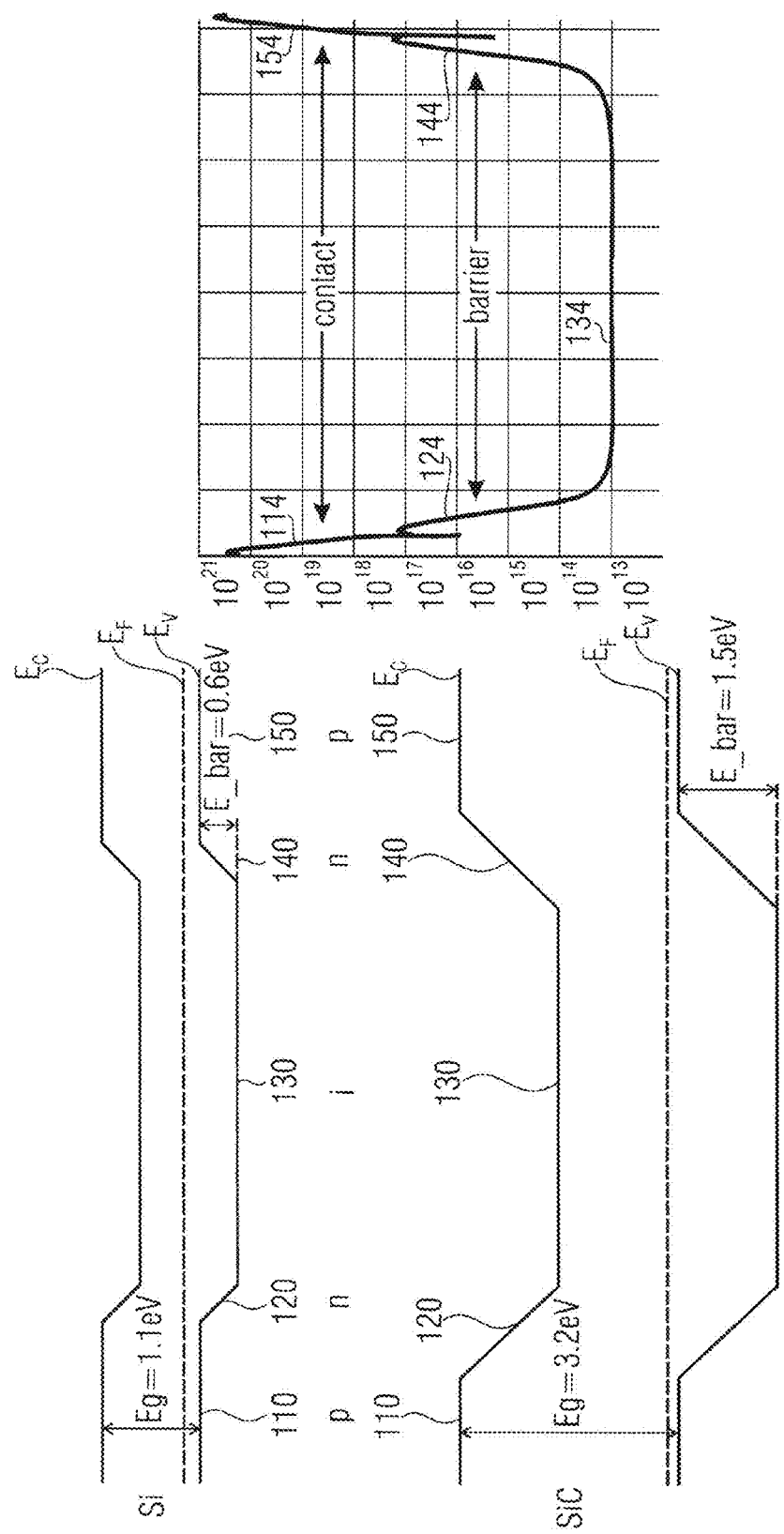
FIG. 2B shows on the right hand side an example of a dopant profile for embodiments of the electrostatic discharge protection element according to FIGS. 1A and 1B with a pninp transistor structure, and on the left hand side the corresponding diagrams of energy band structures for Si and SiC as semiconductor material.

FIG. 2B shows a dopant profile (right hand side of FIG. 2B) and the corresponding energy band profiles of an embodiment of an electrostatic discharge protection element comprising a lateral (FIG. 1A) or vertical (FIG. 1B) pninp transistor structure, or short pninp transistor structure, for Si (top left corner of FIG. 2B) and SiC (bottom left corner of FIG. 2B).

In other words, embodiments according to FIG. 2B are equivalent to embodiments according to FIG. 2A, however with reverse conductivity types for the relevant areas 110 to 150.

The diagram on the right hand side of FIG. 2B shows a dopant profile from the collector area 110 (left hand side) to the emitter area 150 (right hand side), wherein the dopant concentration is given as dopant atoms per $cm^3$ (ordinate) dependent on the spatial position or location between the collector area 110 (left hand side of the diagram) and the emitter area 150 (right hand side of the diagram). Reference sign 114 shows the dopant concentration of the $p^+$-doped collector area 110, reference sign 124 shows the dopant concentration of the n-doped first barrier 120, reference sign 134 refers to the dopant concentration of the lightly doped or intrinsic semiconductor area 130, reference sign 144 refers to the dopant concentration of the n-doped second barrier area 140, and reference sign 154 refers to the dopant concentration of the $n^+$-doped emitter area 150.

The dopant profile of FIG. 2B shows slightly higher maximum dopant concentrations, about a factor of 5 higher, but reduced width for the first and second barrier areas 120, 140 and for the collector area 110 and the emitter area 150, compared to the maximum values of the dopant profile according to FIG. 2A. However, the basic profile is very similar.

The energy band profile on the top left corner of FIG. 2B for Si shows the same bandgap value Eg=1.1 eV and the same energy value E_bar caused by the built-in voltage $V_{BI}$ respectively, the depletion zone. Due to the reverse conductivity types, a barrier for the holes of the collector area 110 and the emitter area 150 are formed, blocking the hole flow from collector area 110 to the emitter area 150, or vice-versa. The areas 110 to 150 according to FIGS. 1A, 1B, 2A and 2B are symmetrically structured with regard to the middle of the semiconductor area. The first and second barrier areas 120, 140 have the same width and the same dopant concentration, and the collector area 110 and the emitter area 150 have the same, or almost the same, dopant concentration. Due to the large difference of the dopant concentrations of the collector area 110 and the emitter area 150, about $10^{20}$ per $cm^3$, compared to the bordering barrier areas 120, 140, with about $N_D$ of about $10^{16}$-$10^{17}$ per $cm^3$, the depletion zone almost completely extends into the barrier areas, whereas the part of the depletion zone extending into the collector area 110 and the emitter area 150 can be neglected (see equation (2) above).

As the areas 110 to 150 according to FIGS. 1A, 1B, 2A and 2B are symmetrically structured with regard to the middle of the semiconductor area, such an embodiment of a transistor-based electrostatic discharge protection element will have very low generation of even-mode harmonics due to the symmetry. As digital signals are less sensitive to harmonics generation, the symmetry for these applications is not necessary.

The npipn structure according to FIG. 2A and the pninp transistor structure according to FIG. 2B block any current, unless the amplitude of the voltage at the data line (connected to the collector) exceeds the breakdown voltage of this transistor structure. Above the breakdown voltage, the avalanche effect will occur and the transistor structure becomes conductive, and thus protects the circuitry connected to the data line by shunting the voltage pulse to ground.

Figure 3A:
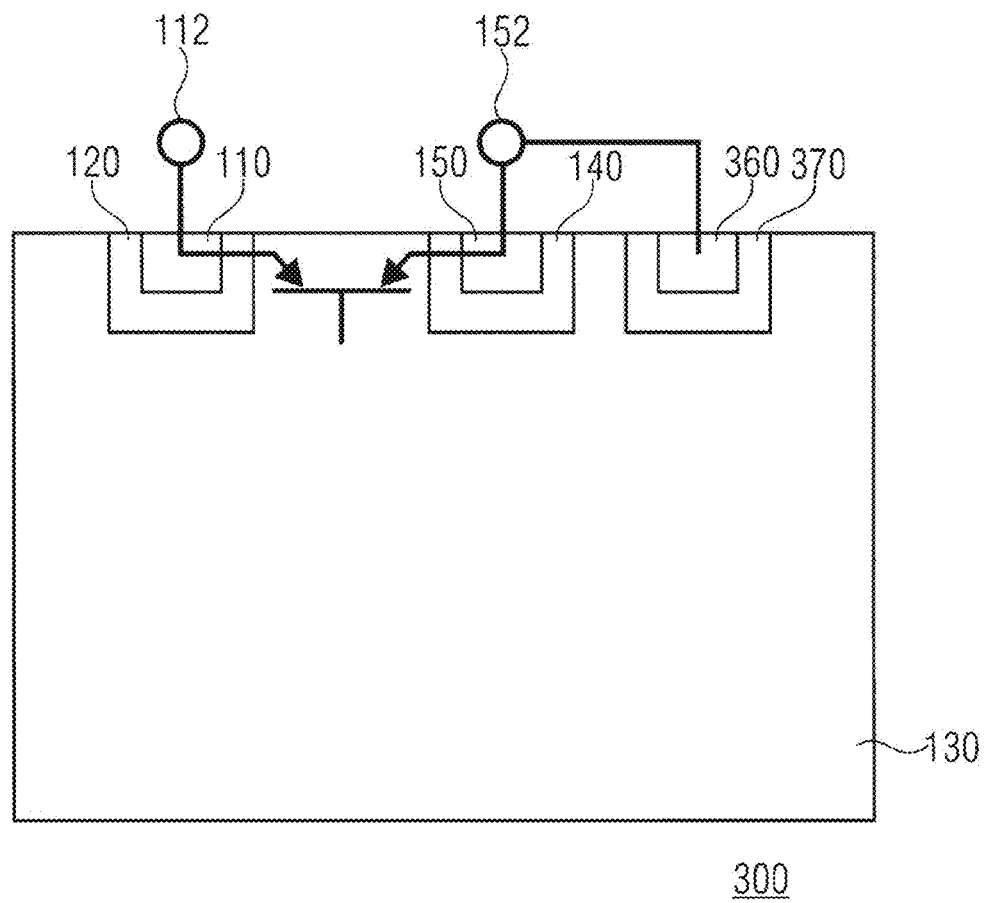
FIG. 3A shows a cross-sectional view of an embodiment of an electrostatic discharge protection element according to FIG. 1A, additionally comprising a base area.

FIG. 3A shows a cross-sectional view of an electrostatic discharge protection element 300 with a lateral transistor structure similar to the one in FIG. 1A. However, the embodiment according to FIG. 3A additionally comprises a base area 360 and a third barrier area 370, wherein the base area 360 borders on the third barrier area 370, and the third barrier area 370 borders on the semiconductor area 130. In FIG. 3A the base area 360 and the third barrier area 370 form a double well structure within the semiconductor area or substrate 130 formed at the top of the semiconductor substrate, wherein the inner well forms the base area 360 and the outer well forms the third barrier area 370 and surrounds the base area 360.

The base area 360 has a second conductivity type and the third barrier area 370 has a first conductivity type, wherein a dopant concentration of the third barrier area 370 is higher than the dopant concentration of the semiconductor area 130, and wherein the dopant concentration of the base area 360 is at least as high as 10 times the dopant concentration of the third barrier area 370. Thus, in embodiments with n-doping or electrons being the first conductivity type, and holes or p-doping being the second conductivity type, the third barrier area forms a hole barrier blocking a hole flow from the base area 360 into the semiconductor area 130, and for the reverse embodiments where a p-doping or holes form the first conductivity type and the n-doping or electrons form the second conductivity type, the third barrier area 370 is at least essentially depleted of holes, and thus forms an electron barrier and prevents an electron flow from the n-doped base area into the semiconductor area or substrate area 130.

For the dopant concentration and the dimensions the same applies for the third barrier area and the base area as already explained for the areas 110 to 150.

As can be seen from FIG. 3A, the base area 360 is electrically connected to the emitter area 150, e.g., via an internal electrical connection line. In other words, both are connected to a ground line 152 as already explained based on FIG. 1A. The implementation of a base area 360 and a third barrier area 370 has the advantage that a leakage occurrence, which might occur during normal operation, and which might lead to an accumulation of charge in the semiconductor area 130, can be removed from the semiconductor area 130 via the base area 360 towards ground. Thus, unwanted de-blocking of the electrostatic discharge protection element during normal operation caused by an accumulation of charge carriers in the semiconductor area 130 is prevented, or at least reduced.

Figure 3B:
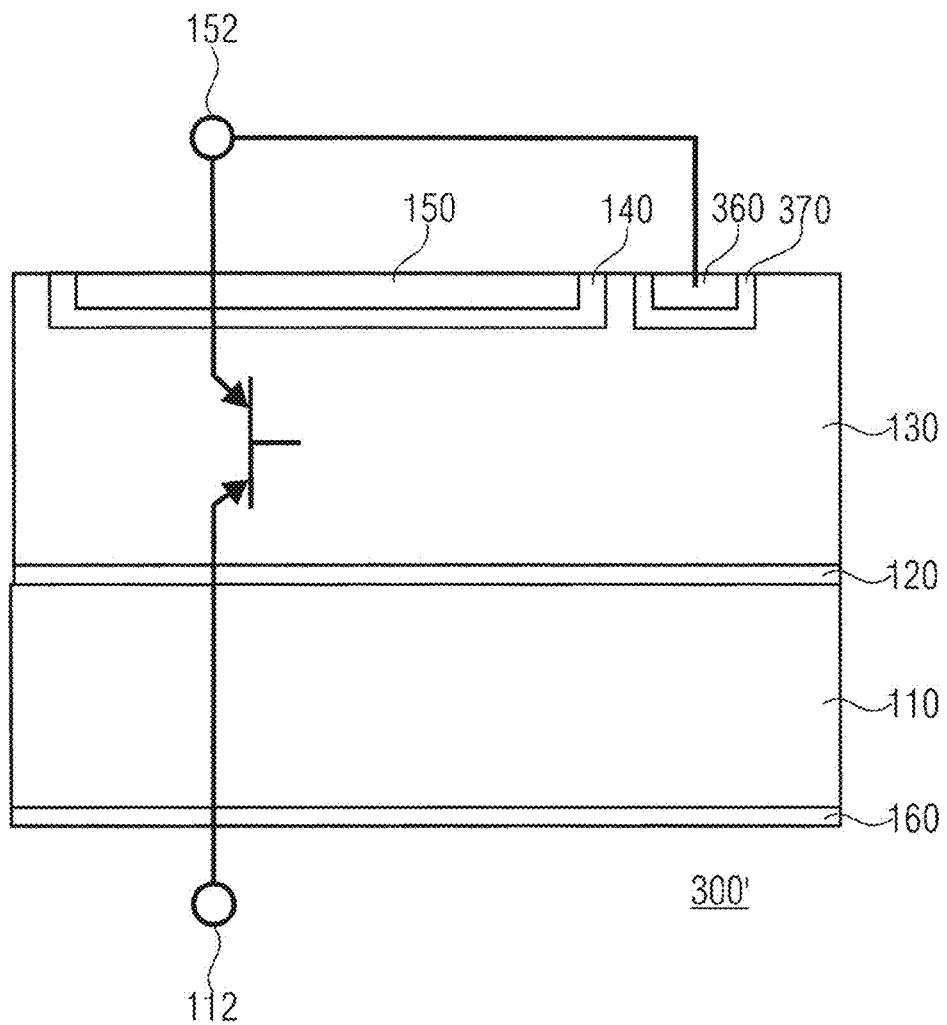
FIG. 3B shows a cross-sectional view of an embodiment similar to FIG. 1B, additionally comprising a base area.

FIG. 3B shows a cross-sectional view of an embodiment of a transistor-based electrostatic discharge protection element with a vertical transistor structure (see vertically oriented transistor symbol in FIG. 3B) similar to the embodiment according to FIG. 1B. In contrast to the embodiment according to FIG. 1B, the embodiment according to FIG. 3B shows reversed positions with regard to the collector area and emitter area, and respectively, with the bordering barrier areas and, additionally comprises a base area 360 and a third barrier area 370. Thus, emitter area 150 and base area 360 can be easily electrically connected, e.g., via an internal electrical connection line, as shown in FIG. 3B. The collector area 110 is formed by the substrate and the first barrier area 120 is arranged on top of and borders on the collector area 110. The semiconductor area 130 is arranged on top of and bordering on the first barrier area 120. Within the semiconductor area 130, two double well structures are arranged at the top surface of the semiconductor area 130. The outer well of the first double well structure forms the second barrier area 140 bordering on the semiconductor area 130, and surrounding the inner well forming the emitter area 150. The outer well of the second double well structure forms the third barrier area 370 bordering on the semiconductor area or substrate area 130 and surrounding the inner well of the double well structure, the inner well forming the base area 360.

With regard to the dopant profile of the npipn- or pninp-transistor structure between collector and emitter, it is referred to the explanations given with regard to FIGS. 1A to 2B. For the dopant concentration and the dimensions the same applies for the third barrier area and the base area as already explained for the areas 110 to 150.

Based on the aforementioned concept, not only transistor based electrostatic discharge protection elements can be realized, but also diode based electrostatic discharge protection elements, e.g., npinp or pnipn diodes. Embodiments of the diode based electrostatic discharge protection element comprise a cathode area having a first conductivity type; a first barrier bordering on the cathode area, the first barrier area having a second conductivity type, which differs from the first conductivity type; a semiconductor area bordering on the first barrier area, the semiconductor area being an intrinsic semiconductor area or having a first or second conductivity type with a dopant concentration that is lower than a dopant concentration of the first area; a second barrier area bordering on the semiconductor area, the second barrier area having a first conductivity type and a higher dopant concentration than the semiconductor area; and an anode area bordering on the second barrier area, the anode area having a second conductivity type.

Analog to the transistor-based embodiments, the dopant concentration of the first barrier area and the dopant concentration of the second barrier area are defined such that the first barrier area and the second barrier area are at least essentially depleted from charge carriers.

In further embodiments, the dopant concentration of the first barrier area and the second barrier area and of the semiconductor area are such that they are completely depleted from the respective majority of charge carriers.

Figure 4:
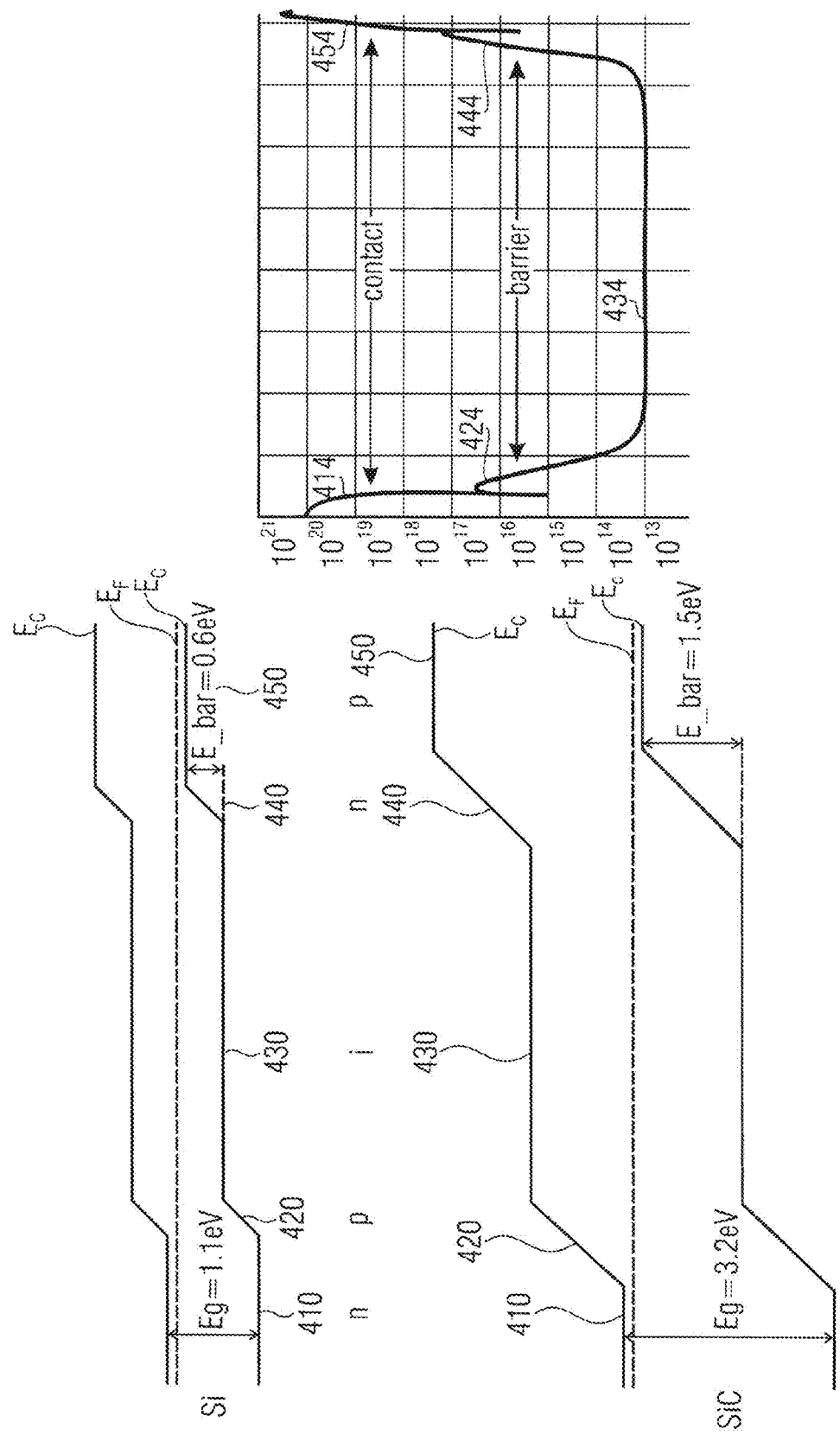
FIG. 4 shows on the right hand side an example of a dopant profile for diode based embodiments of the electrostatic discharge protection element with an npinp diode structure, and on the left hand side the corresponding diagrams of energy band structures for Si and SiC as semiconductor material.

FIG. 4 shows a dopant profile of a diode-based electrostatic discharge protection element in atoms per $cm^3$ dependent on the position within the diode-structure, starting from the cathode area 410 (left hand side) to the anode area 450 (right hand side), wherein the dopant concentration is given as dopant atoms per cm$^3$ (ordinate). Reference sign 414 shows the dopant concentration of the n$^+$-doped cathode area 410, reference sign 424 shows the dopant concentration of the p-doped first barrier 420, reference sign 434 refers to the dopant concentration of the lightly n-doped or intrinsic semiconductor area 430, reference sign 444 refers to the dopant concentration of the n-doped second barrier area 440, and reference sign 454 refers to the dopant concentration of the p$^+$-doped anode area 450.

On the left hand side of FIG. 4, the respective energy band profile of an npinp diode structure for Si is shown on the top and for SiC it is shown at the bottom of FIG. 4.

Due to the large differences in the doping concentrations between the cathode area 410 and the first barrier area 420, and between the anode area 450 and the second barrier area 440, both barrier areas 420, 440 as well as the semiconductor area 430 are completely depleted and the depletion zone almost completely extends into the barrier areas, whereas the part of the depletion zone within the cathode area 410 and the anode area 450 can almost be neglected.

As can be seen from FIG. 4, the diode-based electrostatic discharge protection element blocks in both directions. In the forward direction (in FIG. 4 from right to left), the potential barriers or energy barriers E_bar insulate until they are completely reduced by an externally applied voltage. Afterwards, the electrostatic discharge protection element behaves like a normal diode in forward direction. In a backward or blocking direction, the electrostatic discharge protection element shows a breakdown behavior with avalanche multiplication. The breakdown in blocking direction tends strongly to "hotspots." Thus, the breakdown is not well suited as an electrostatic discharge protection element. Furthermore, the breakdown voltage is relatively high due to the large distance of the contacts, the anode and the cathode areas, in combination with the low doping in the barrier areas.

Similar to FIGS. 2A and 2B, FIG. 4 also shows the higher bandgap energy of SiC and the higher energy values of the barrier E_bar and the higher width of the depletion zone.

Figure 5A:
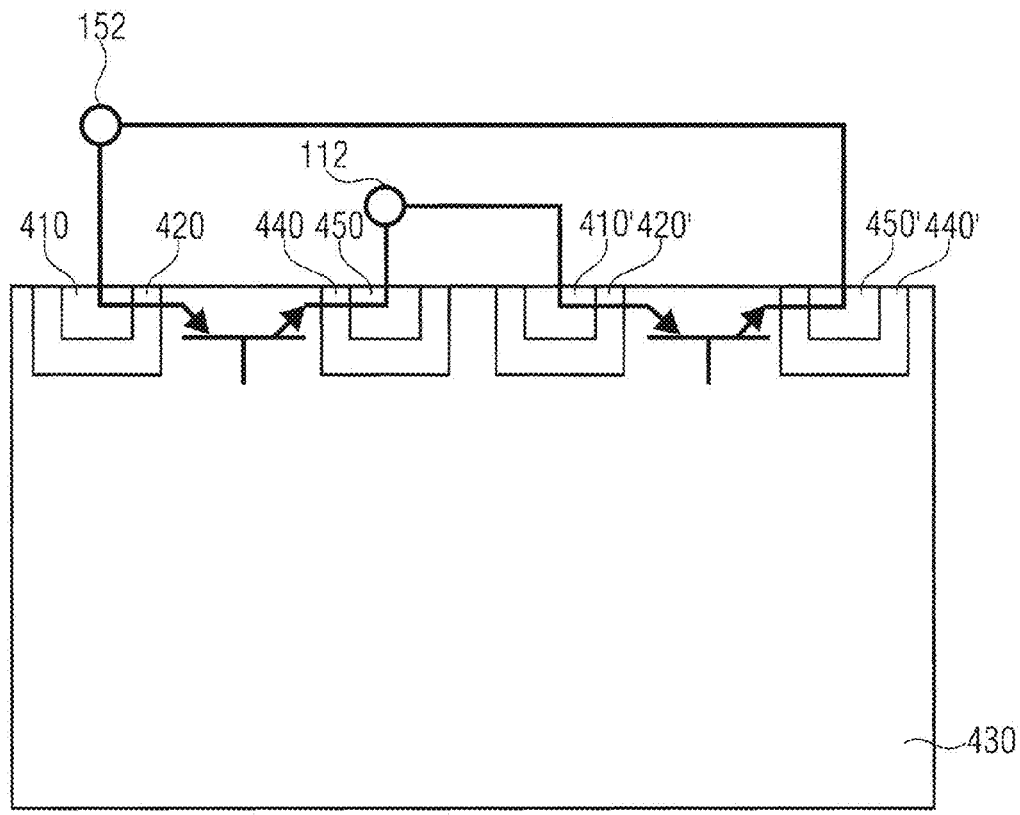
FIG. 5A shows a cross-sectional view of a diode-based embodiment of an electrostatic discharge protection element comprising two lateral diode structures connected anti-parallel to each other.

FIG. 5A shows a cross-sectional view of a diode-based electrostatic discharge protection element with two lateral diode structures, which are connected anti-parallel to each other with regard to a data line contact or, in general, data line 112 and a ground contact 152, or in general, a ground line. FIG. 5A shows a first diode structure comprising a cathode area 410, a first barrier area 420, a semiconductor area 430, a second barrier area 440 and an anode area 450, wherein the cathode area 410 is electrically connected to the ground contact 152, and wherein the anode area 450 is electrically connected to the data line contact 112. The cathode area 410 has a first conductivity type, the first barrier area 420 has a second conductivity type, the semiconductor area 430 is an intrinsic semiconductor area, or has the first or second conductivity type, the second barrier area 440 has the first conductivity type and the anode area 450 has the second conductivity type. The second diode structure has the same structure with regard to the dimensions and distances of the areas and their doping as the first diode structure and comprises a cathode area 410', the first barrier area 420', the semiconductor area or substrate 430, the second barrier area 440' and an anode area 450', wherein the anode area 450' is connected to the data line contact 112 via its cathode area 410' and is connected to the ground line 152 by its anode area 450'. The cathode area 410' has a first conductivity type, the first barrier area 420' has a second conductivity type, the semiconductor area 430' is an intrinsic semiconductor area, or has the first or second conductivity type, the second barrier area 440' has the first conductivity type and the anode area 450' has the second conductivity type.

To avoid the influence of the aforementioned "hotspots" in blocking direction, the two diode structures are implemented such that their breakdown voltage in forward direction is smaller than the breakdown voltage in backward direction. In other words, due to the anti-parallel connection of both diode structures, the second diode structure 410' to 450' breaks down in forward direction (for positive ESD pulse) before the first diode structure 410 to 450 breaks down in backward direction, and vice-versa for negative amplitudes of the ESD pulse applied to the data line contact 112.

Figure 5B:
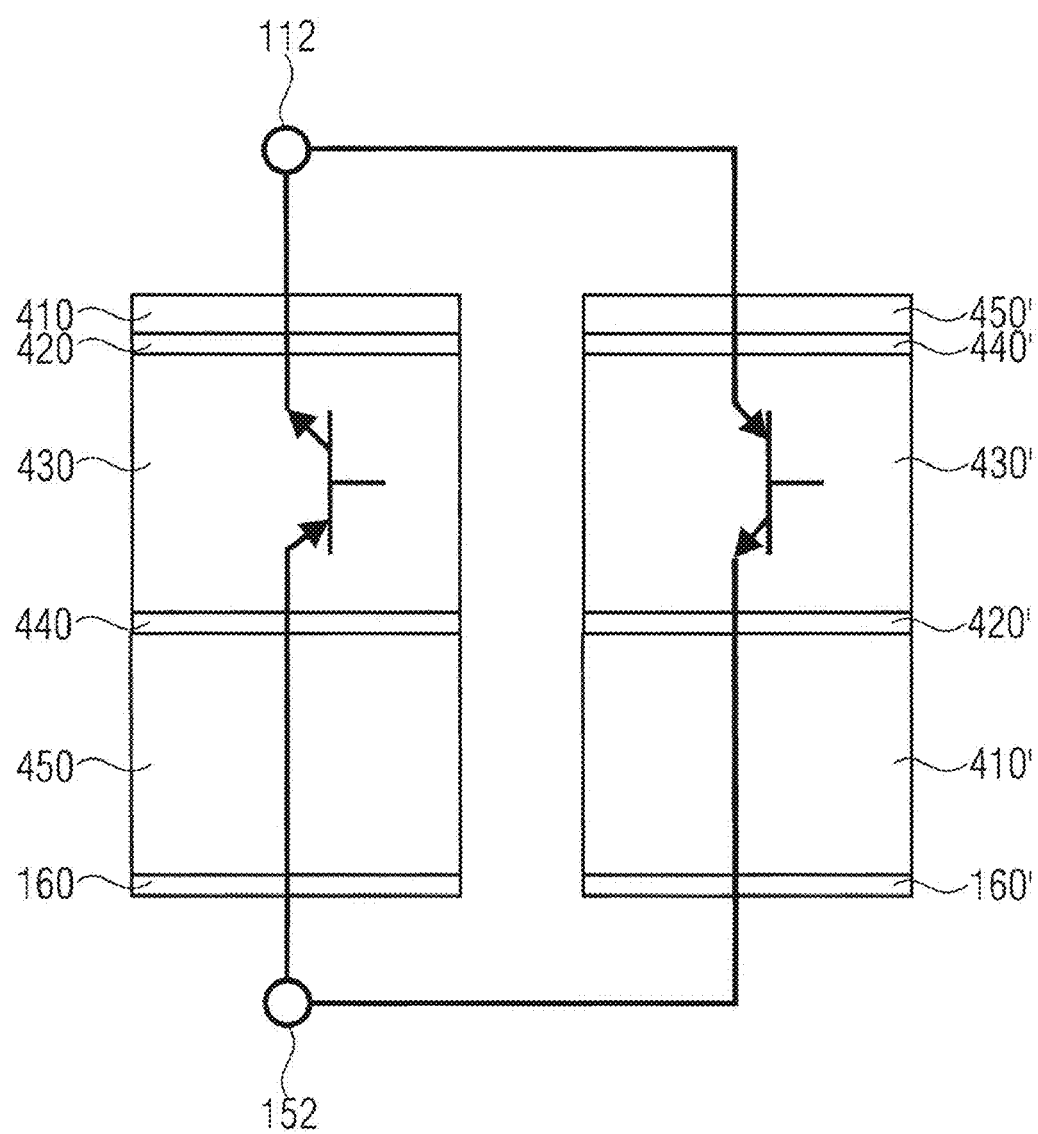
FIG. 5B shows a cross-sectional view of a diode-based embodiment of an electrostatic discharge protection element comprising two vertical diode structures connected anti-parallel to each other.

FIG. 5B shows a cross-sectional view of a second diode-based embodiment of an electrostatic discharge protection element comprising two vertical diode-structures connected anti-parallel to the data line contact 112 and the ground contact 152. The anti-parallel connection in FIG. 5B is implemented by connecting the two diode structures in parallel, the upmost areas 410 and 450' with the data line 112 and the lowest areas 450 and 410' with the ground line 152, wherein the two diode structures are implemented with reverse conductivity types to achieve the anti-parallel behavior.

FIG. 5B shows a first diode structure comprising the cathode area 410, the first barrier area 420, the semiconductor area 430, the second barrier area 440 and the anode area 450, wherein the cathode area 410 is electrically connected to the data line contact 112, and wherein the anode area 450 is electrically connected to the ground contact 152. The second diode structure has the same structure with regard to the dimensions and distances of the areas and their doping as the first diode structure and comprises a cathode area 410', the first barrier area 420', the semiconductor area or substrate 430, the second barrier area 440', however, the order from top to bottom has been changed bottom up. The anode area 450' is connected to the data line contact 112, and the cathode area 410' is connected to the ground line 152.

FIG. 5B shows a back side contact 160 bordering on and being connected to the anode area 450, and a back side contact 160' bordering on and being connected to the cathode area 410'. Both back side contacts 160, 160' are optional.

The different areas 410 to 450 of the first diode structure and the areas 410' to 450' of the second diode structure can be implemented as layers, similar to FIG. 1B.

The two diode structures can be implemented on different substrates. In a further embodiment, both diode structures are implemented on the same substrate, however, are separated from each other by a vertical electrically insulating structure.

Figure 6A:
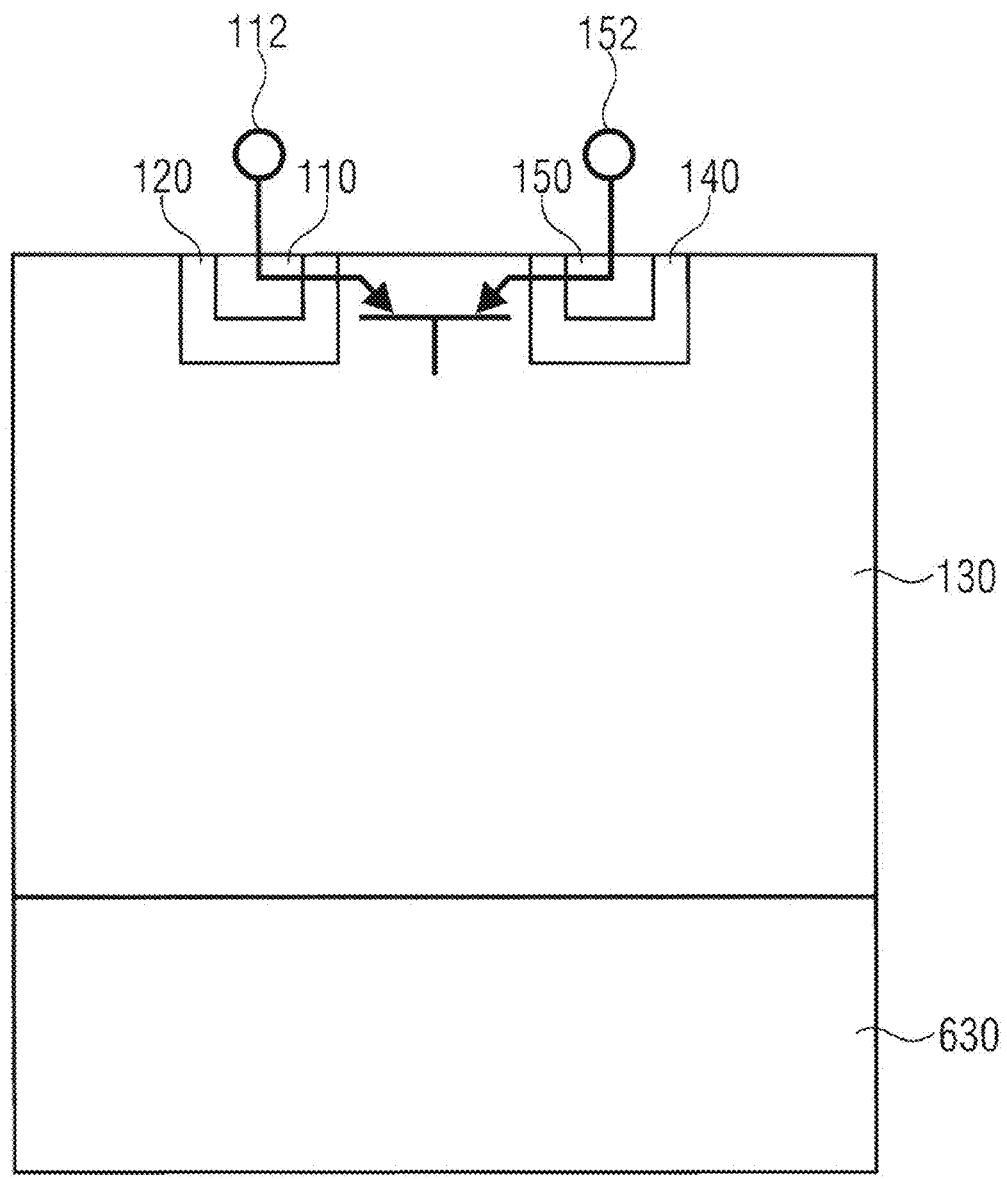
FIG. 6A shows a cross-sectional view of an embodiment of the electrostatic discharge protection element similar to FIG. 1A with a highly doped substrate and a lower doped epitaxy layer thereon.
Figure 6B:
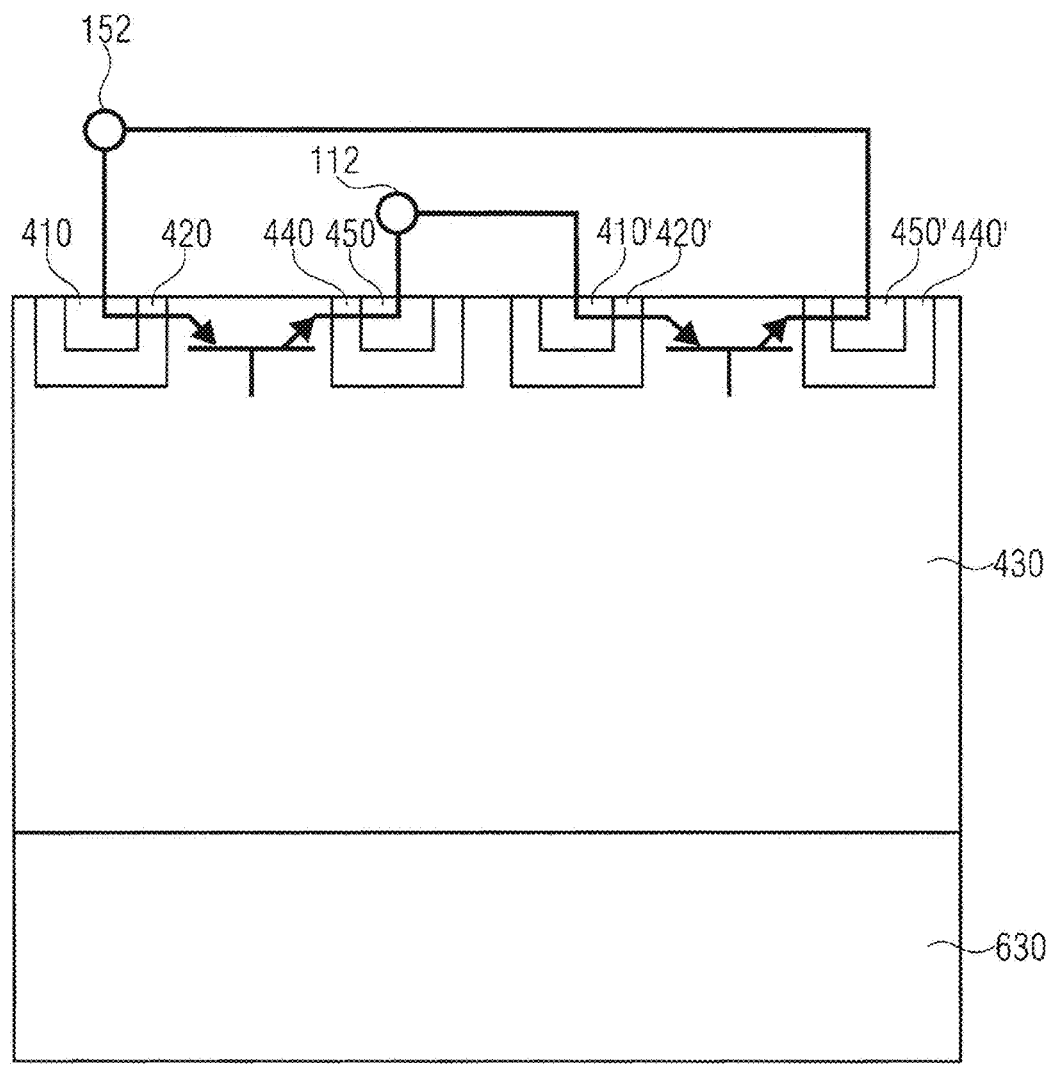
FIG. 6B shows an embodiment of an electrostatic discharge protection element similar to FIG. 5A with a highly doped substrate and a lower doped epitaxy layer thereon.

Embodiments of the electrostatic discharge protection element with lateral transistor structures or diode structures can also be implemented on highly doped substrates with lightly doped epitaxy layers as shown in FIGS. 6A and 6B.

FIG. 6A shows a cross-sectional view of a transistor-based embodiment of an electrostatic discharge protection element similar to FIG. 1A. In contrast to FIG. 1A, the semiconductor area 130 is formed by the lightly doped epitaxy layer 130. The epitaxy layer has the first or second conductivity type and is arranged above and borders on the highly doped substrate layer 630. The substrate layer has the second conductivity type and a higher dopant concentration as the semiconductor area 130 and lower or similar dopant concentrations as the collector area 110 or the emitter area 150.

FIG. 6B shows a cross-sectional view of the diode-based embodiment of an electrostatic discharge protection element comprising two lateral diode structures connected anti-parallel to each other. The embodiment according to FIG. 6B is similar to the embodiment described in FIG. 5A, however, in contrast thereto, the semiconductor area 130 is formed by the lightly doped epitaxy layer 430. The epitaxy layer 430 has the first or second conductivity type and is arranged on top and borders on the highly doped substrate area 630.

The highly doped substrate area 630 has a first or second conductivity type with a dopant concentration which is higher than the dopant concentration of the semiconductor area 130, 430.

Figure 7A:
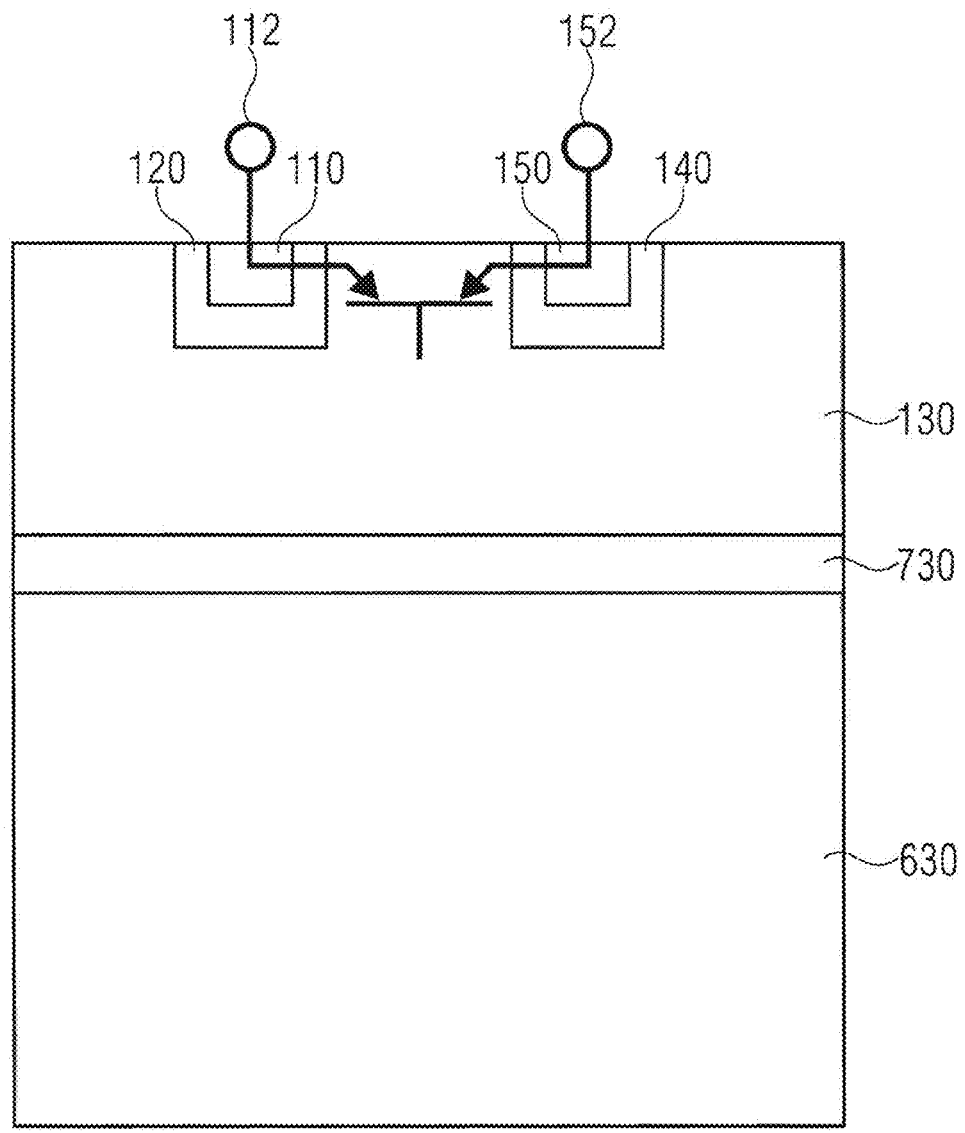
FIG. 7A shows a cross-sectional view of an embodiment of an electrostatic discharge protection element according to FIG. 6A, additionally comprising a barrier area between the highly doped substrate and the lower doped epitaxy layer.
Figure 7B:
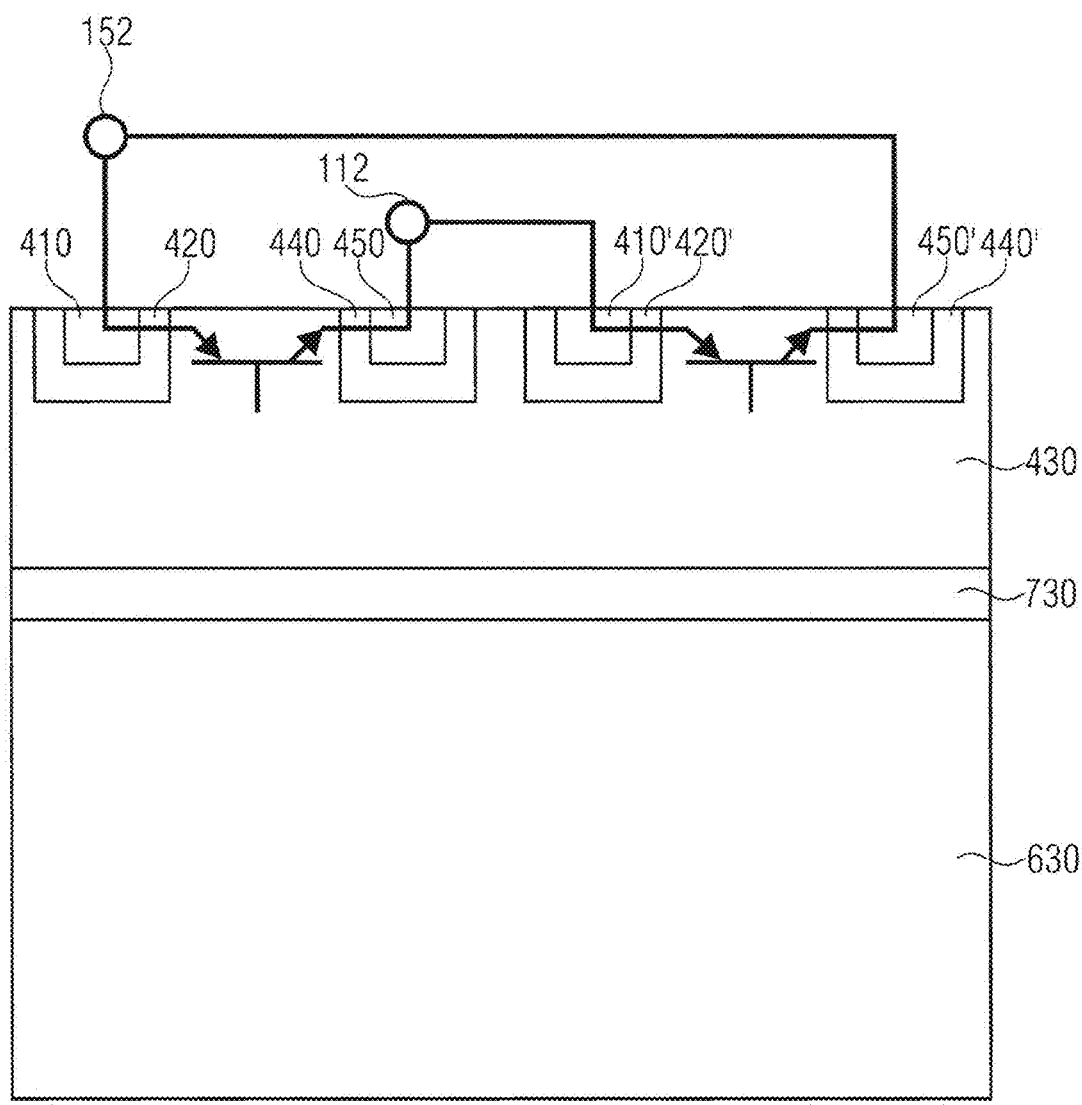
FIG. 7B shows a cross-sectional view of an embodiment of an electrostatic discharge protection element according to FIG. 6B, additionally comprising a barrier area arranged between the highly doped substrate and the lower doped epitaxy layer.

The necessary thickness of the lightly doped epitaxy layer 130, respectively 430, depends directly upon the amplitude of the signal applied to the data line and the requirements with regard to the linear behavior. The thickness or width of the epitaxy layer 130, 430 can be significantly reduced, if, like for the contact areas (collector area, emitter area, base area, anode area, cathode area) a doped barrier layer 730 is implemented, as shown in FIGS. 7A and 7B. The barrier layers 730 are only doped to such an extent that the internal pn voltage, or built-in voltage $V_{BI}$, can essentially or fully deplete the barrier layer without the need for any external or bias voltage to be applied. The barrier layer 730 is arranged between the lightly doped epitaxy layer and the highly doped substrate, and has a different conductivity type compared to the conductivity type of the epitaxy layer 130, 430 and the substrate area 630 to block the charge carrier emission from the highly doped substrate to the lightly doped epitaxy layer. In other words, the barrier layer 730 has the first conductivity type, if the epitaxy layer 130 and the substrate area 630 have the second conductivity type or the barrier layer 730 has the second conductivity type, if the epitaxy layer 130 and the substrate area 630 have the first conductivity type.

FIG. 7A shows the embodiment of the electrostatic discharge protection element according to FIG. 6A with an additional barrier layer 730 and a reduced width or depth of the epitaxy layer 130.

FIG. 7B shows a cross-sectional view of the embodiment of the electrostatic discharge protection element according to FIG. 6B with the additional barrier layer 730 and the reduced width of depth of the epitaxy layer 430.

As described, based on the previous figures, embodiments of the electrostatic discharge protection element provide a means for electrostatic discharge protection of data lines and antennas, and especially for those with high data rates or high carrier frequencies, e.g., within the Gigahertz region, large amplitudes, e.g., several tens of Volts, and high requirements with regard to the linear behavior. Thus, they can, for example, be used for electrostatic discharge protection of antennas of a mobile telephone. However, embodiments of the electrostatic discharge protection element are not limited to such use, but may also be used for other applications as previously described, e.g., for other analog or digital signals.

Compared to coils or polymer elements, embodiments of the electrostatic discharge protection element are based on semiconductor structures, which generate only small peak voltages at the beginning of an electrostatic discharge occurrence due to their fast switching time. Furthermore, embodiments of the electrostatic discharge protection element show no degradation or at least a lower degradation, after many electrostatic discharge pulses due to the use of mono-crystalline semiconductor materials, and thus, enable a longer lifetime of the protection element itself and the circuitry protected by the protection element. Besides this, embodiments of the electrostatic discharge protection element have only a small capacity value, and thus, also show a good insulation characteristic for low frequencies.

Embodiments of the electrostatic protection element comprise a semiconductor structure that generates between two contact areas, e.g., between the collector area, the emitter area and/or the base area in the case of transistor structures, or between the cathode area and the anode area in the case of diode structures, a charge carrier free zone due to the use of doped barrier areas and the intrinsic potential of pn-junctions. The charge carrier free zone is also referred to as depletion zone. The potential barriers or energy barriers E_bar generated by the charge carriers, in other words the depletion zones, insulate the contact areas during normal operation. In case of an electrostatic discharge occurrence, the barriers are decomposed and the protection element switches on so that the charge of the electrostatic charge pulse can be shunted at low resistance.

The aforementioned embodiments of the electrostatic discharge protection element provide a passive electrostatic discharge protection element that only needs two contacts 112 and 152, a first one for connecting the electrostatic discharge protection element with the data line and a second one for connecting the electrostatic discharge protection element with ground. The barrier areas bordering on the emitter area, the collector area, and eventually on the base area, are only doped to such an extent that the intrinsic potential of the pn-junction, i.e., the built-in voltage $V_{BI}$, can deplete the barrier areas. In other words, the higher the bandgap of the used semiconductor material, e.g., 0.7 eV for Ge, 1.1 eV for Si, 1.4 eV for GaAs, 3.0 eV for SiC, and 3.5 eV for GaN, the more the barrier areas may be doped and the higher potential barriers can be provided. The higher the potential barrier and the band gap of the semiconductor material, the higher the amplitude of the signal that can still be blocked without additional blocking voltage at the base contact.

For amplitudes in the area of 10 Volts and a distance of the contacts, e.g., collector area and emitter area, in the range of 2-10 μm, a semiconductor with a large bandgap, e.g., SiC is necessary. The semiconductor area or substrate needs to have a sufficiently small doping concentration in the range of smaller than $10^{15}$ per $cm^3$.

In case of embodiments of the electrostatic discharge protection element without base area or base contact (see, e.g., FIGS. 1A and 1B), the base of the transistor structure is floating, i.e., the base is not connected to an external potential in a direct manner. In case leakage currents are applied to a base, the base tends to accumulate charge. To reduce the influence of the leakage currents, a base contact 360 can be implemented with the transistor structure (see FIGS. 3A and 3B). This base contact or base barrier is internally connected galvanically with the emitter area and the ground contact of the device, and thus, fixes the base to the ground potential. Charges that float into the base due to leakage currents can be discharged via the base area. The finished device or chip nevertheless only shows two external contacts 112, 152. To avoid a breakdown between collector and base, the base area has to have a sufficiently large distance from the collector area.

A plurality of these electrostatic discharge protection elements can be realized on one semiconductor chip. A particular embodiment of the passive chip, therefore, comprises additionally, e.g., in addition to the transistor structures shown in FIGS. 1A and 1B, a further data line contact, and a further electrostatic discharge (ESD) protection element. The further electrostatic discharge protection element comprises a further collector area, a further first barrier area, a further semiconductor area, a further second barrier area and a further emitter area. The further collector area has a third conductivity type. The further first barrier area borders on the collector area and has a fourth conductivity type. The further semiconductor area borders on the further first barrier area and is an intrinsic semiconductor area or has a fourth conductivity type and a dopant concentration which is lower than a dopant concentration of the first barrier area. The further second barrier area borders on the further semiconductor area and has the fourth conductivity type and a higher dopant concentration than the further semiconductor area. The further emitter area borders on the further second barrier area and has the third conductivity type. The dopant concentration of the further first barrier area and of the further second barrier area are defined such that the further first barrier area and the further second barrier area are essentially depleted of charge carriers of the fourth conductivity type, when no voltage is applied to the electrostatic discharge protection element. The further emitter area is electrically connected to the ground contact and the further collector area is connected to the further data line contact, and wherein the passive chip further comprises a further electrical connection line connecting the further data line contact to the further collector area.

Thus, above embodiments can have both, npipn and pnipn transistor structures, or can have only npipn or only pninp transistor structures. In case only npipn or only pninp transistor structures are used, the first conductivity type is equal to the third conductivity type and the second conductivity type is equal to the fourth conductivity type. The same applies for ESD protection chips with several single or anti-parallel diode structures.

Figure 8A:
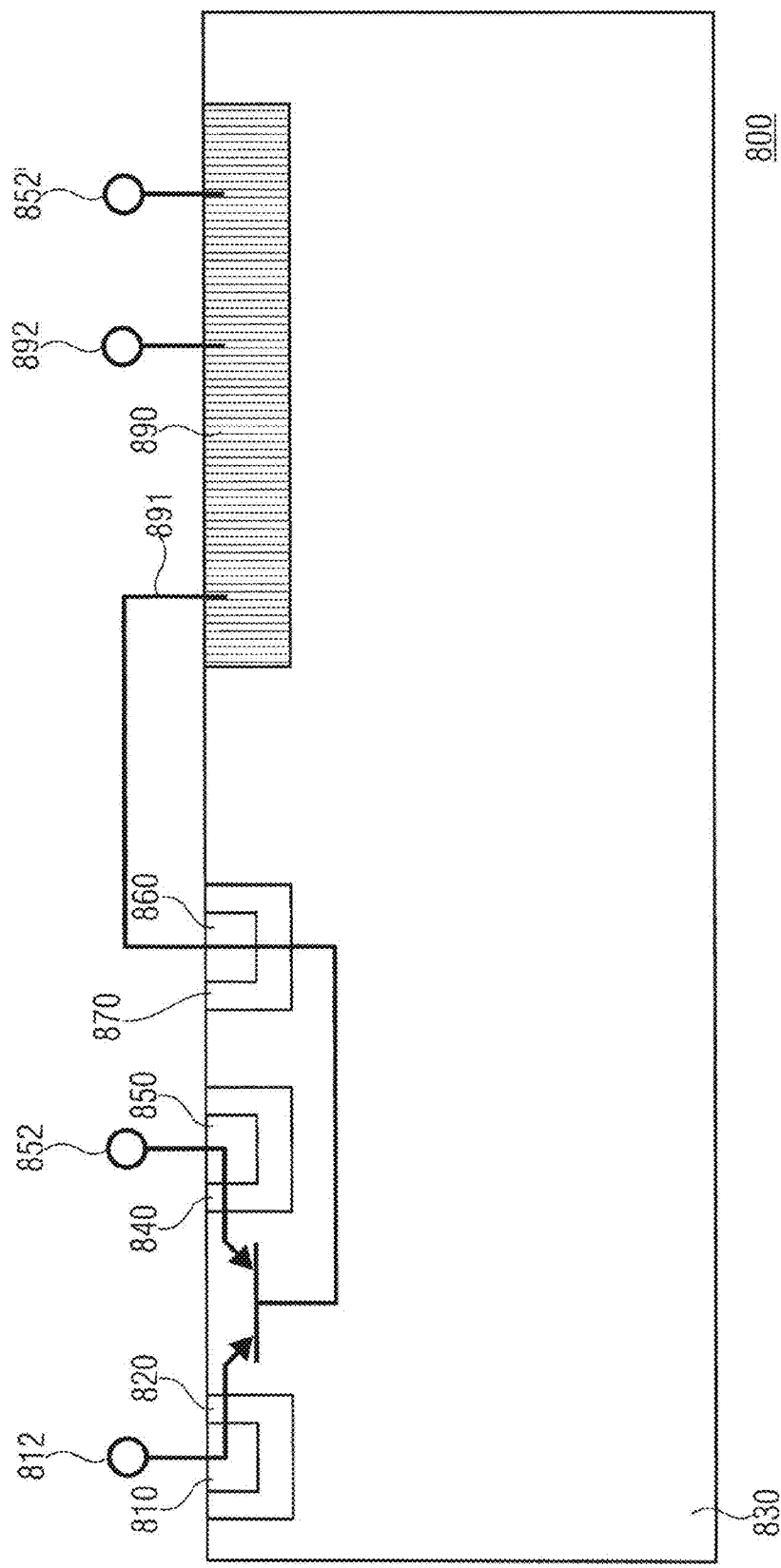
FIG. 8A shows a cross-sectional view of a transistor-based embodiment of an electrostatic discharge protection element with a lateral transistor structure and a charge pump connected to the base area of the lateral transistor structure of the electrostatic discharge protection element.

FIG. 8A shows an embodiment of an electrostatic discharge protection device 800, e.g., a discrete electrostatic discharge protection chip 800, which comprises an electrostatic discharge protection element and a charge pump integrated on the same semiconductor substrate.

The electrostatic discharge protection element of electrostatic discharge protection device 800 comprises a collector area 810, a first barrier area 820, a semiconductor area 830, a second barrier area 840, and an emitter area 850. In FIG. 8A, the semiconductor area 830 is formed by a semiconductor substrate 830 and the collector area 810 borders on the first barrier area 820, the semiconductor area 830 borders on the first barrier area 820, the second barrier area 840 borders on the semiconductor area 830, and the emitter area 850 borders on the second barrier area 840. Furthermore, the electrostatic discharge protection element comprises a base area 860 and a third barrier area 870, wherein the base area 860 borders on the third barrier area 870, and the third barrier area 870 borders on the semiconductor area 830. The collector area 810 has a first conductivity type. The first barrier area 820 has a second conductivity type, which is different to the first conductivity type. The semiconductor area 830 has the first or second conductivity type and a dopant concentration that is lower than the dopant concentration of the first barrier area 820. The second barrier area 840 has the second conductivity type and a dopant concentration that is higher than the dopant concentration of the semiconductor area 830. The emitter area 850 has the first conductivity type. Thus, FIG. 8A shows an electrostatic discharge protection element with a lateral transistor structure similar to the one shown in FIG. 3A.

In embodiments with lateral transistor structures according to FIG. 8A, the lateral width of the first barrier area 820 and the second barrier area 840 can lie within a range of 0.05 μm to 2 μm and in further embodiments within a range of 0.2 μm and 1 μm. The lateral width of the semiconductor area 830 between the two barrier areas 820 and 840, i.e., the lateral distance between the two barrier areas 820, 840, can lie within a range of 0.3 μm to 10 μm, and in further embodiments, e.g., in a range of 5 μm to 8 μm.

The charge pump 890 comprises a connection to a power supply contact or input 892, which can be connected to an external supply voltage Vcc, a connection line or ground line for connecting a charge pump 890 with an external ground contact 852', and an output 891 for supplying a fixed negative bias voltage to the base area 860.

Embodiments of the electrostatic discharge protection device 800 can alternatively or additionally comprise other diode or transistor structures as described previously for the passive embodiments. However, in contrast to the embodiments described based on FIGS. 1A to 7B, the barrier areas 820, 840 and 870 are only doped to such an extent that the barrier areas are only essentially or fully depleted when the charge pump supplies the fixed predefined voltage to the base area 860. Without the application of the fixed voltage or any other voltage, the first, second, and third barrier areas, and eventually also the semiconductor area, are depleted by less than 60%.

In other words, the electrostatic discharge protection device comprises a combination of an electrostatic discharge protection element and an integrated circuit for generating a negative bias voltage of the base area, both disposed in semiconductor area 830 on the same chip. Therefore, these embodiments may also be referred to as active electrostatic discharge protection elements or devices.

During normal operation, i.e., during a blocked state of the electrostatic discharge protection element, the electrostatic discharge protection device 800 only shows a small and nearly constant capacity. To achieve the blocking state, i.e., achieve the depletion of the barrier areas 820, 840, and 870, the base area 860 is biased via the semiconductor area or substrate 830 comprising the integrated charge pump 890 in reverse direction (reverse bias) with regard to the emitter area 850 and the collector area 810.

Embodiments of the electrostatic discharge protection device can, for example, be used with npn transistors, or as shown in FIG. 8A, with npipn-transistor structures, as electrostatic discharge protection elements. These npn or npipn-transistor structures require a negative bias voltage under the assumption that the data line to be protected does not have any bias voltage. Compared to pnp-transistors, npn-transistors or npipn-transistors have a lower resistance value in an electrostatic discharge occurrence compared to pnp-transistors, due to their higher conductivity.

Electrostatic discharge protection device 800 requires three contacts: the first contact 812 to connect the data line to be protected with the collector area 810; a second contact 892 to connect the charge pump 890 with a positive supply voltage Vcc; and a third contact 852, which can be connected internally to the emitter area 850 and to the ground contacts 852' of the charge pump to connect them with an external ground. In further embodiments, these ground contacts 852 and 852' can also be separate external contacts.

Specific embodiments of the electrostatic discharge protection devices can be implemented to have only those 3 contacts as external contacts, providing a discrete electrostatic discharge protection chip.

Figure 8B:
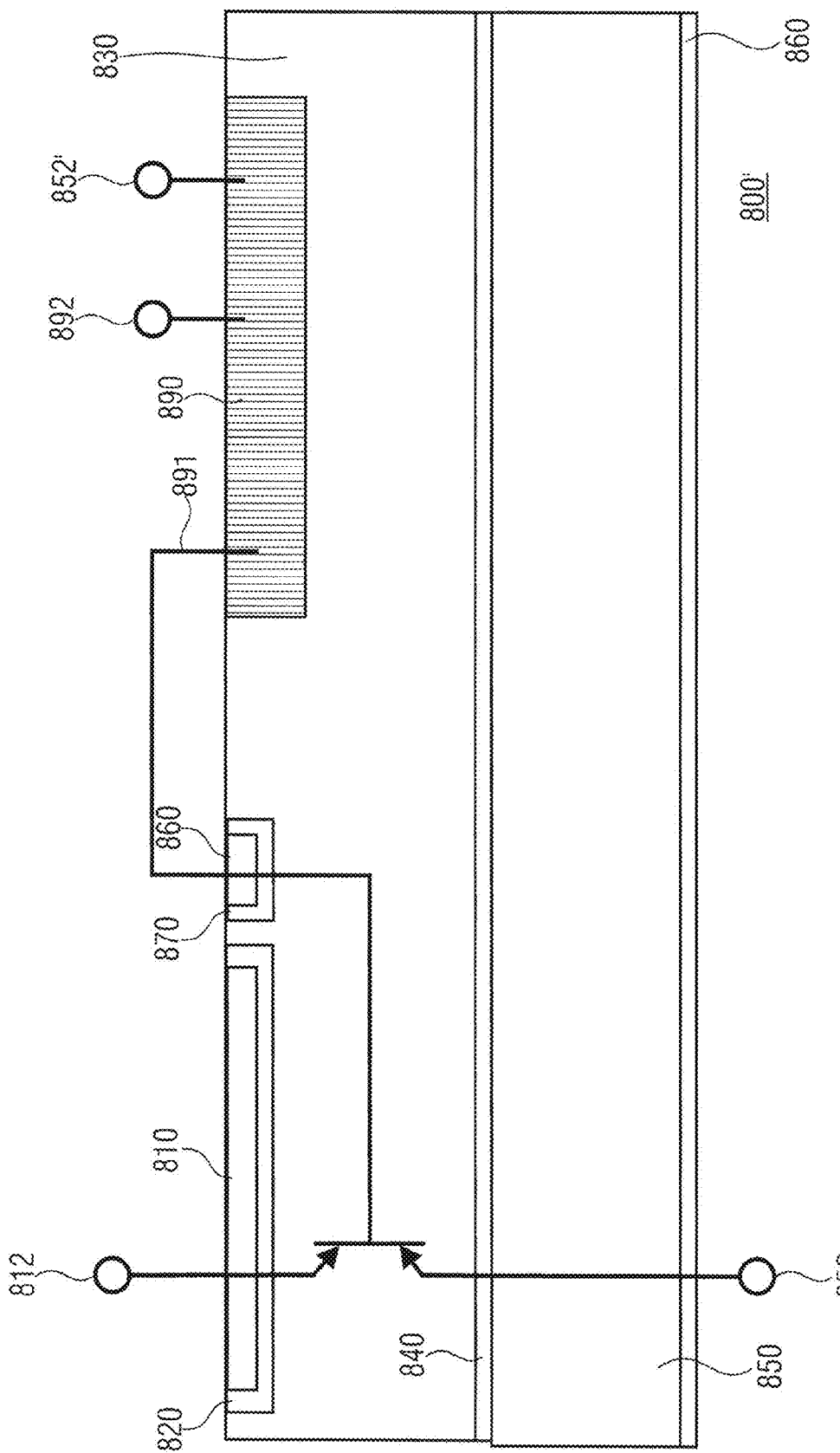
FIG. 8B shows a cross-sectional view of a transistor-based embodiment of an electrostatic discharge protection element with a vertical transistor structure and a charge pump connected to the base area of the vertical transistor structure of the electrostatic discharge protection element.

FIG. 8B shows a cross-sectional view of an embodiment of an electrostatic discharge protection device 800', e.g., a discrete electrostatic discharge protection chip 800', which comprises an electrostatic discharge protection element and a charge pump 890 integrated on the same semiconductor substrate. The electrostatic discharge protection device has a vertical transistor structure, the vertical transistor structure comprising a collector area 810 arranged on top and bordering on a first barrier area 820, the first barrier area 820 arranged on top and bordering on the semiconductor area 830, the semiconductor area 830 is arranged on top and bordering on the second barrier area 840, and the second barrier area is arranged on top and bordering on the emitter area 850. Furthermore, the electrostatic discharge protection element comprises a third barrier area 870 bordering on the semiconductor area 830 and being arranged at the upper surface thereof, and a base area 860 bordering on the third barrier area 870 and being arranged at the upper surface of the semiconductor area. In FIG. 8B the substrate forms the emitter area 850. In other words, FIG. 8B shows an embodiment similar to FIG. 3B, however with a top-down order with regard to the emitter area and collector area.

The charge pump 890 comprises a connection to a power supply contact or input 892, which can be connected to an external supply voltage Vcc, a connection line or ground line for connecting a charge pump 890 with an external ground contact 852', and an output 891 for supplying a fixed negative bias voltage to the base area 860.

In embodiments with vertical transistor structures according to FIG. 8B, the vertical width or thickness of the first barrier area 820 and the second barrier area 840 can lie within a range of 0.05 μm to 2 μm and in specific embodiments within a range of 0.2 μm to 1 μm. The vertical width or thickness of the semiconductor area 830 between the two barrier areas 820, 840 can lie within a range of 0.3 μm to 10 μm, and in particular embodiments in a range from 5 μm to 8 μm.

For both kinds of embodiments (FIGS. 8A and 8B) the dopant concentration of the collector area 810, the emitter area 850 and the base area 860 is at least $10^{18}$ dopant atoms, i.e., donor or acceptor atoms, per $cm^3$, and in particular embodiments, at least $10^{19}$ dopant atoms per $cm^3$. The dopant concentration of the first barrier area 820, the second barrier area 840 and the third barrier area 870 can lie within a range of $10^{15}$-$10^{18}$ dopant atoms per $cm^3$ and in specific embodiments within a range $10^{16}$-$10^{17}$ dopant atoms per $cm^3$. The dopant concentration of the semiconductor area 830 is at maximum $10^{15}$ dopant atoms per $cm^3$, and can also be zero or close to zero.

Figure 8C:
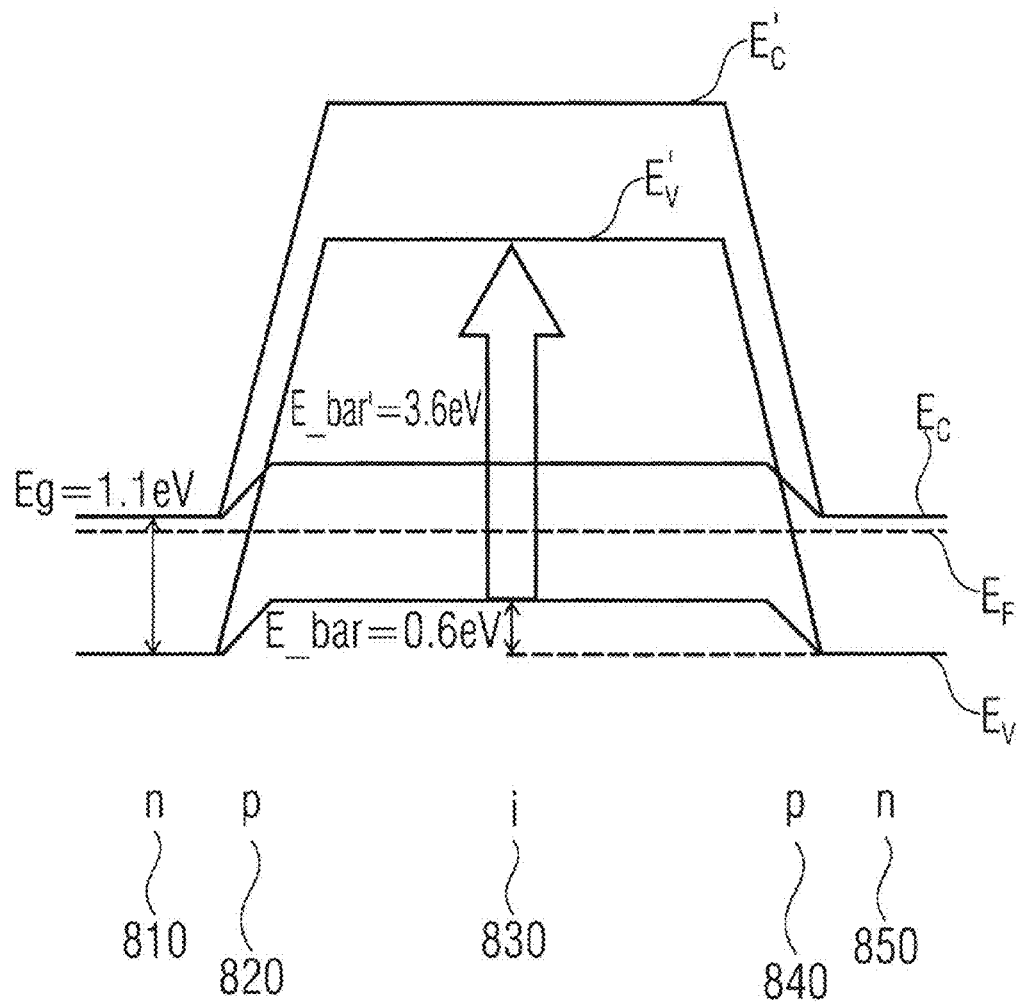
FIG. 8C shows an example of a change of the energy band profile for an npipn transistor structure according to FIGS. 8A and 8B based on Si as semiconductor material, when the fixed voltage is applied to the base area.

FIG. 8C shows the increase of the potential barrier or voltage barrier depicted as the equivalent barrier energy E_bar for the npipn-transistor structures as shown in FIGS. 8A and 8B. The reference signs $E_c$ therein refer to the energy level of the conducting band and $E_v$ the energy level of the valence band for Silicon Si in case no bias voltage is applied to the base area 860 by the charge pump 890. As can be seen from FIG. 8C, the voltage barrier, or its equivalent energy E_bar, is about 0.6 eV. The charge pump 890 can, e.g., be adapted to supply a continuous voltage of −3 V. The built-in voltage $V_{BI}$ together with the bias voltage −3 V cause a complete depletion of the barrier areas 820, 840, and 870, and thus cause an increase by 3.0 eV of the barrier energy E_bar', to about 3.6 eV, and an increase by the same energy amount of the energy levels of the valence band and the conducting band within the semiconductor barrier 830, see $E_c'$ and $E_v'$ in FIG. 8C. Thus, the npipn-transistor structure shown in FIGS. 8A and 8B now can not only block voltages from −4 V to +4 V, but can also block amplitudes of the data line signal from −40 V to +40 V.

When designing embodiments of the electrostatic discharge protection device, care has to be taken that the charge pump 890 is sufficiently insulated from the electrostatic discharge protection element, and thus from the data line to be protected. At high frequency signals with high power, a sufficient distance between the charge pump 890 and the electrostatic discharge protection element is required, e.g., a lateral distance between the charge pump and the third barrier area 870 of about 10-100 μm. The negative bias or reverse bias voltage improves the characteristics of the electrostatic discharge protection element compared to the characteristics that can be achieved without the reverse bias voltage.

Embodiments according to FIGS. 8A and 8B show, e.g., an improved linear behavior, better characteristics at maximum power, improved switch-on delays and blocking voltages. In other words, embodiments of the electrostatic discharge protection device facilitate the protection of electrostatic discharge sensitive contacts in electronic systems without essentially degrading the electrical characteristics of the system, e.g., linearity, generation of harmonics.

Instead of the voltage inverting charge pump adapted to convert a positive supply voltage Vcc to a negative bias voltage for reverse biasing the electrostatic discharge protection element, any other voltage inverter can be used that is adapted to provide a stable negative output voltage at the required voltage level, based on a positive input voltage.

Furthermore, although embodiments with npn or npipn transistor structures have been described, other embodiments can also comprise pnp or pninp transistor structures. Therefore, embodiments can comprise a circuit 890 adapted to provide a fixed voltage of a first polarity at output 891 when a voltage of a second polarity is applied to the input 892 of the circuit, wherein the second polarity is different to the first polarity. In case the first conductivity type is an n-doping and the second conductivity type is a p-doping, the fixed voltage of the first polarity is a negative voltage and the voltage of the second polarity is a positive voltage. In case the first conductivity type is a p-doping and the second conductivity type is an n-doping, the voltage of the first polarity is a positive fixed voltage and the voltage of the second polarity is a negative voltage.

As substrate materials, Silicon can be used, however, other semiconductor materials such as Diamond, GaAs, GaN, SiC, InP, and Ge can be used. Besides the electrostatic discharge protection element and the charge pump, further elements such as switches, amplifiers, resistors, coils or capacitors can be integrated into the electrostatic discharge protection device.

Figure 9:
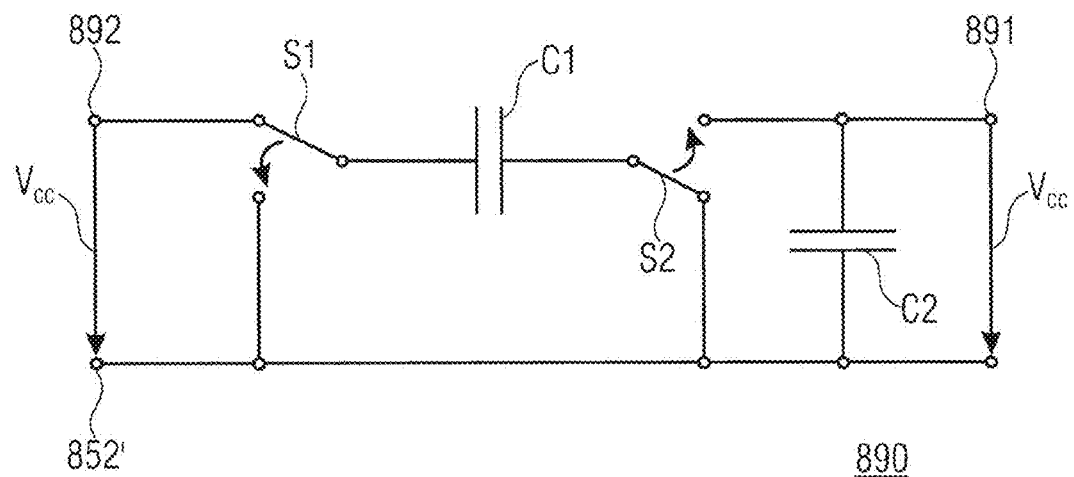
FIG. 9 shows a circuit diagram of an example of a charge pump.

FIG. 9 shows a circuit diagram of an example of an inverting charge pump 890. The charge pump 890 comprises a power supply contact or input 892 for connecting the charge pump with a positive supply voltage Vcc, a ground contact 852' for connecting the charge pump with an external ground, and a voltage output 891 for providing internally (with regard to the chip) a negative voltage, e.g., −Vcc to the electrostatic discharge protection element as shown in FIGS. 8A and 8B. The inverting charge pump 890 further comprises a first switch S1 and a second switch S2, a series capacitor C1 connected in series with the two switches, and a shunt capacitor C2. In a first step, when the switches S1 and S2 are in the positions as shown in FIG. 9, the series capacitor C1 is charged to the voltage approximately Vcc. Then, both switches S1 and S2 are switched so that the shunt capacitor C2 is now charged with a reverse voltage. After several switching cycles, the voltage at the shunt capacitor C2 reaches approximately −Vcc, as shown in FIG. 9. The control circuit controlling the switching of switches S1 and S2 is not shown in FIG. 9 and is powered by the supply voltage Vcc.

Although embodiments of the electrostatic discharge protection element or device have been described with symmetric structures (see, e.g., FIGS. 2A and 2B, FIG. 4), further embodiments of the electrostatic discharge protection element or device can comprise different widths, e.g., for the collector area compared to the emitter area, for the cathode area compared to the anode area or for the first barrier area compared to the second barrier area, etc, to achieve different blocking voltages for different directions or different threshold voltages for negative and positive voltages applied on the data line to be protected and to get different grade of depletion of charge carriers in first and second barrier layers 120 and 140 and in semiconductor area 130. Further embodiments of the electrostatic discharge protection element or device can comprise total asymmetric structure with only one barrier layer for the collector (first) or for the emitter (second), as will be described based on FIGS. 10A and 10B in the following.

In the following, further embodiments of electrostatic discharge protection elements and devices will be described, which can be used for electrostatic discharge protection of digital signals with only positive or only negative voltage amplitudes. In other words, the embodiments described in the following block the data signal only in one direction, however, provide protection against electrostatic discharge pulses of both polarities, i.e., negative or positive polarities.

Figure 10A:
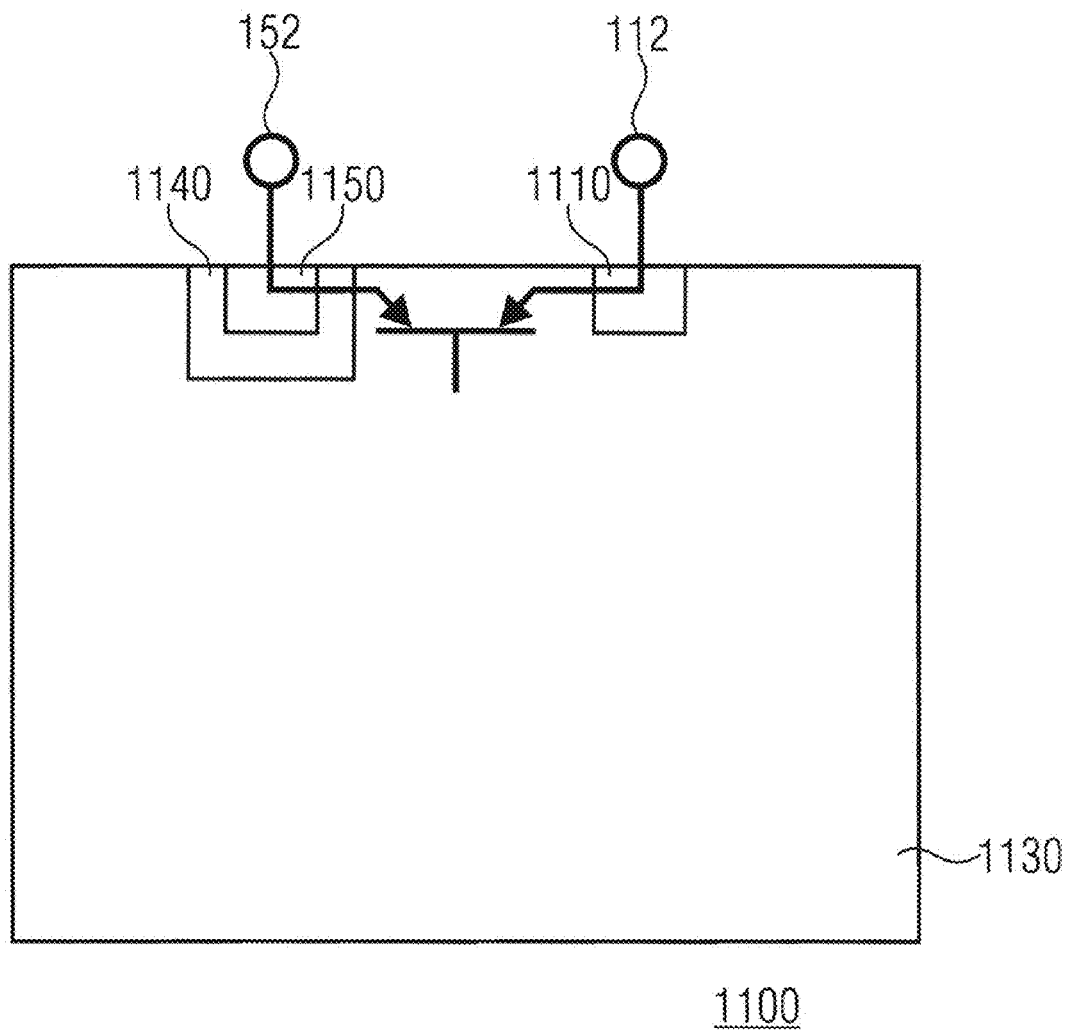
FIG. 10A shows a cross-sectional view of a transistor-based embodiment of an electrostatic discharge element with a lateral transistor structure comprising a single barrier area bordering on the emitter area of the lateral transistor structure.

FIG. 10A shows a cross-sectional view of a further transistor based embodiment of an electrostatic discharge protection element with a lateral transistor structure (see laterally oriented transistor symbol in FIG. 10A with collector contact 112 and emitter contact 152). The electrostatic discharge protection element 1100 comprises a collector area 1110, a semiconductor area 1130, a barrier area 1140, and an emitter area 1150. In FIG. 10A, the semiconductor area 1130 can also be referred to as substrate. Furthermore, the collector area 1110 borders on the semiconductor area 1130, the semiconductor area 1130 borders on the barrier area 1140, and the barrier area 1140 borders on the emitter area 1150. The collector area 1110 has a first conductivity type, the semiconductor area 1130 is an intrinsic semiconductor area, or a semiconductor area having the first or second conductivity type, the barrier area 1140 has a second conductivity type, and the emitter area 1150 has the first conductivity type.

In FIG. 10A the emitter area 1150 and the barrier area 1140 form a double well structure implanted into the semiconductor area 1130, wherein the outer well of the double well structure forms the barrier area 1140, which surrounds the inner well forming the emitter area 1150. The collector area is formed by a single well structure implanted into the semiconductor area 1130. FIG. 10A shows an embodiment, wherein the collector area 1110 and the emitter area 1150 are arranged at the top surface of the semiconductor area or substrate 1130.

Figure 10B:
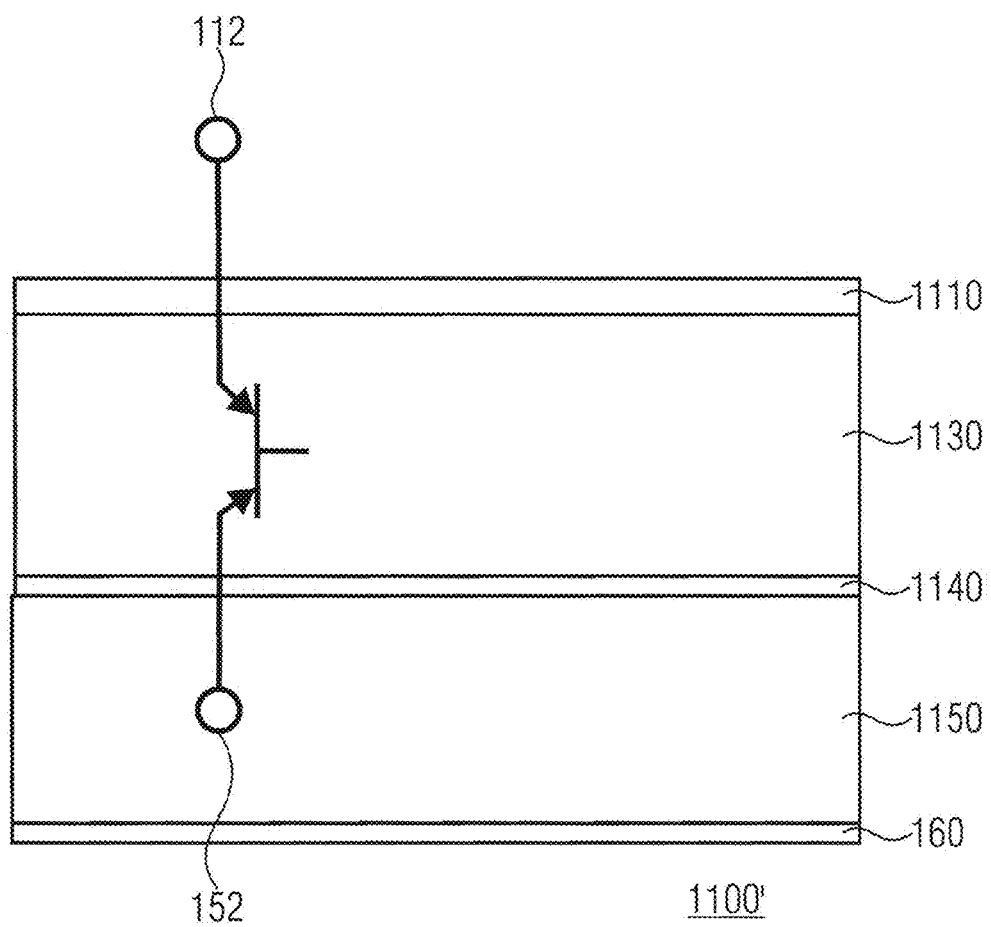
FIG. 10B shows a cross-sectional view of a transistor-based embodiment of an electrostatic discharge protection element with a vertical transistor structure and a single barrier area bordering on the emitter area.

FIG. 10B shows a cross-sectional view of another transistor-based embodiment of an electrostatic discharge protection element 1100' with a vertical transistor structure (see vertically oriented transistor symbol in FIG. 10B with collector contact 112 and emitter contact 152). As in FIG. 10A, the electrostatic discharge having protection element 1100' comprises a collector area 1110, a semiconductor area 1130, a barrier area 1140 and an emitter area 1150, wherein the semiconductor area 1130 borders on the collector area 1110, the barrier area 1140 borders on the semiconductor area 1130 and the emitter area 1150 borders on the barrier area 1140.

In contrast to FIG. 10A, the collector area 1110, the semiconductor area 1130, the barrier area 1140 and the emitter area 1150 are not arranged in a lateral order but in a vertical order, wherein each area is formed, for example, by a horizontal layer, and wherein the emitter area 1150 is arranged on top of an optional back side contact 160 (according to the orientation of FIG. 10B), the barrier area 1140 is arranged on top of the emitter area 1150, the semiconductor area 1130 is arranged on top of the barrier area 1140, and wherein the collector area 1110 is arranged on top of the semiconductor area 1130. Like for the embodiment according to FIG. 10A, the collector area 1110 has a first conductivity type, the semiconductor area 1130 is an intrinsic semiconductor area, or a semiconductor area having a first or second conductivity type, the barrier area 1140 has the second conductivity type, and the emitter area 1150 has the first conductivity type.

As already explained based on the previous embodiments, the collector area 1110 is connected to an internal or external data contact 112, and the emitter area 1150 is electrically connected to an internal or external ground contact 152.

In embodiments with lateral transistor structures according to FIG. 10A, the lateral width of the barrier area 1140 can lie within a range of 0.05 µm to 2 µm and in further embodiments within a range of 0.2 µm to 1 µm. The lateral width of the semiconductor area 1130 between the collector area 1110 and the barrier area 1140, i.e., the lateral distance between the barrier area 1140 and the collector area 1110, can lie within a range of 0.3 µm to 10 µm, and in further embodiments, e.g., within a range of 5 µm to 8 µm.

In certain embodiments with vertical transistor structures according to FIG. 10B, the vertical width or thickness of the barrier area 1140 can lie within a range of 0.05 µm to 2 µm and in specific embodiments within a range of 0.2 µm to 1 µm. The vertical width or thickness of the semiconductor area between the barrier area 1140 and the collector area 1110 can lie within a range of 0.3 µm to 10 µm, and in particular embodiments within a range of 5 µm to 8 µm.

For both embodiments (FIG. 10A and FIG. 10B) the dopant concentration of the collector area 1110 and the emitter area 1150 can be at least $10^{18}$ dopant atoms, i.e., donor or acceptor atoms, per $cm^3$, and in particular embodiments at least $10^{19}$ dopant atoms per $cm^3$. The dopant concentration of the barrier area 1140 can lie within a range of $10^{15}$ to $10^{18}$ dopant atoms per $cm^3$ and in specific embodiments within a range of $10^{16}$ to $10^{17}$ dopant atoms per $cm^3$. The dopant concentration of the semiconductor area 1130 is at maximum $10^{15}$ dopant atoms per $cm^3$, and can also be zero or close to zero in intrinsic cases. In certain embodiments, the dopant concentration of the barrier area 1140 is at least 50 times higher than the dopant concentration of the semiconductor area 1130, and in particular embodiments at least 100 times higher. The dopant concentration of the collector area 1110 and the emitter area 1150 is at least 100 times higher than the dopant concentration of the barrier area, and in particular embodiments, at least 200 times higher than the dopant concentration of the barrier area 1140. Furthermore, the dopant concentration of the collector area 1110 and the emitter area 1150 is at maximum 1000 times higher than the dopant concentration of the semiconductor area 1130.

In embodiments of electrostatic discharge protection elements with one barrier area, the dopant concentrations of the barrier area 1140 and the semiconductor area 1130 are chosen such (see equations 1-4) that the barrier area 1140 is about 20% to 80% depleted of charge carriers of the second conductivity type, or in other words, is depleted of its respective majority charge carriers, e.g., depleted from holes for the npipn transistor structure, when no voltage is applied to the electrostatic discharge protection element.

In further embodiments, the dopant concentrations of the barrier area 1140 and the semiconductor area 1130 are chosen such that the barrier area 1140 is about 40% to 60% depleted of charge carriers of the second conductivity type, or in other words, when no voltage is applied to the electrostatic discharge protection element.

In the following, the operation of the electrostatic discharge elements according to FIGS. 10A and 10B and further details with regard to the dopant concentration will be explained.

For operation, the emitter area 1150 is connected via ground contact 152 to an internal or external ground potential, and the collector area 1110 is connected via the data line contact to an internal or external data line, which is to be protected from electrostatic discharges by the protection element 1100, 1100'.

For the electrostatic discharge protection of positive digital signals, i.e., digital signal values with amplitudes of 0V and positive voltages with regard to a ground potential, an nipn transistor structure (from collector to emitter) is used, wherein the collector area 1110 is an n$^+$-doped area, the semiconductor area is an intrinsic or lightly-doped n- or p-doped area, the barrier area 1140 is a p-doped area and the emitter area 1150 is an n$^+$-doped area. The dopant concentrations and the width of the different areas are designed such that the threshold voltage or breakdown voltage is sufficiently high so as to block any current flowing from the collector area 1110 to the emitter area 1150 during normal operation. However, the dopant concentrations and the width of the different semiconductor areas are also defined such that electrostatic discharge pulses of positive and negative polarity above the breakdown voltage of the transistor structure switch the transistor structure on to protect the data line and the corresponding circuitry by shunting the electrostatic discharge pulse to ground.

In other words, for electrostatic discharge protection of data lines with positive signals, the collector area 1110 and the emitter area 1150 according to FIGS. 10A and 10B comprise an n-doping as first conductivity type, and the barrier area 1140 comprises a p-doping as second conductivity type.

For electrostatic discharge protection of digital signals with negative amplitudes, i.e., amplitudes ranging from 0V to negative polarities with regard to the ground potential, the inverse conductivity types are used for the respective areas. In other words, embodiments for electrostatic discharge protection of negative data signals comprise a collector area 1110 and an emitter area 1150 with a p-doping as first conductivity type, and a barrier area 1140 with an n-doping as second conductivity type.

In a further embodiment for electrostatic discharge protection, the barrier area 1140 is not arranged at or around the emitter area 1150, but at or around the collector area 1110. Such embodiments, in other words, comprise a lateral or vertical transistor structure, wherein the barrier area borders on the collector area, the semiconductor area borders on the barrier area and the emitter area borders on the semiconductor area. Such embodiments can also be used for electrostatic discharge protection of positive or negative digital signals.

For electrostatic discharge protection of positive data signals, a pnip transistor structure (from collector to emitter) is used, wherein the collector area 1110 and the emitter area 1150 comprise a p-doping as first conductivity type, and the barrier area 1140 comprises an n-doping as second conductivity type.

For protecting data signals with negative amplitudes, the inverse transistor structure is used. In other words, such embodiments comprise an npin transistor structure, wherein the collector area 1110 and the emitter area 1150 comprise an n-doping as first conductivity type, and the barrier area 1140 comprises a p-doping as second conductivity type.

The aforementioned embodiments of electrostatic discharge elements 1100, 1100' can be integrated into substrates comprising further integrated circuits comprising the circuitry to be protected by the electrostatic discharge element, or can be implemented as discrete devices, for example chips, as already explained previously for the other embodiments.

Furthermore, embodiments of the electrostatic discharge element with one barrier area can be implemented in substrates comprising a semiconductor material like silicon, but can also be implemented in substrates comprising other semiconductor material with a higher band gap as, for example, SiC, GaAs, GaN, and diamond.

Furthermore, the explanations given to the other embodiments apply in an analogous manner also to the embodiments described comprising one barrier area.

The collector areas, the emitter areas, the base areas, the cathode areas, the anode areas, the barrier areas and the other areas like the epitaxy layers comprise a semiconductor material. In certain embodiments the aforementioned areas comprise the same semiconductor material and can be produced by locally doping a single semiconductor substrate, wherein a substrate is a continuous piece of semiconductor material. The substrate can be, for example, provided as semiconductor wafer, wherein a plurality of electrostatic discharge protection elements or devices can be produced on a single wafer, which is afterwards diced to obtain individual electrostatic discharge protection elements or devices.

However, it should be noted that the term "substrate" is also used for referring to the typically lower part (with regard to the orientation of the Figs.) of the substrate as a whole, upon which the other areas are located or into which the other areas are embedded. Therefore, in FIGS. 1A, 3A, 5A and 8A the semiconductor layers 130, 430 and 830 can also be referred to as "substrate" or "substrate area," in FIGS. 1B, 5B and 8B, the emitter areas 150, 450 and 850 and the collector area 410' can be also referred to as "substrate," and in FIG. 3B the collector 110 can also be referred to as "substrate."

Embodiments of a method of producing an electrostatic discharge (ESD) protection element with a transistor structure, as, for example, described based on FIGS. 1A to 2B, comprise the following steps.

Providing a semiconductor substrate. Generating in the semiconductor substrate a collector area having a first conductivity type. Generating in the semiconductor substrate a first barrier area bordering on the collector area, the first barrier area having a second conductivity type. Generating in the semiconductor substrate a semiconductor area bordering on the first barrier area, the semiconductor area being an intrinsic semiconductor area or a semiconductor area having the first or second conductivity type and a dopant concentration which is lower than a dopant concentration of the first barrier area. Generating in the semiconductor substrate a second barrier area bordering on the semiconductor area, the second barrier area having the second conductivity type and a higher dopant concentration than the semiconductor area. Generating in the semiconductor substrate an emitter area bordering on the second barrier area, the emitter area having the first conductivity type. Wherein the doping of the different areas is performed in a manner that the dopant concentration of the first barrier area and of the second barrier area are such that the first barrier area and the second barrier area are more than 95% or fully depleted of charge carriers of the second conductivity type, when no voltage is applied to the electrostatic discharge protection element.

Further embodiments of the method of producing an electrostatic discharge (ESD) protection element with a transistor structure, as, for example, described based on FIGS. 3A and 3B, comprise additionally to the above steps the following steps.

Generating in the semiconductor substrate a third barrier area bordering on the semiconductor area, the third barrier area having the first conductivity type and a higher dopant concentration than the semiconductor area. Generating in the semiconductor substrate a base area bordering on the third barrier area, the base area having the second conductivity type. Wherein the doping is performed in a manner that the dopant concentration of the third barrier area is such that the third barrier area is more than 95% or fully depleted by charge carriers of the first conductivity type, when no voltage is applied to the electrostatic discharge protection element.

An embodiment of a method of producing a passive chip comprises additionally to the steps of the above mentioned methods for producing an electrostatic discharge (ESD) protection element with a transistor structure, the following steps.

Generating a ground contact at the semiconductor substrate for connecting the chip with an external ground voltage. Generating a data line contact at the semiconductor substrate for connecting a chip with an external data line. Electrically connecting the ground contact to the emitter area, e.g., by generating an electrical connection line between the ground contact and the emitter area, and electrically connecting the data line contact to the collector area, e.g., by generating another electrical connection line between the data line contact and the collector area.

Embodiments of the method for producing the passive chip with a transistor structure, wherein the transistor structure comprises a base area, can comprise additionally the following step.

Generating an electrical connection line connecting the ground contact to the base area.

An embodiment of a method of producing an electrostatic discharge protection element with a diode structure comprises the following steps.

Providing a semiconductor substrate. Generating in the semiconductor substrate a cathode area having a first conductivity type. Generating in the semiconductor substrate a first barrier area bordering on the cathode area, the first barrier area having a second conductivity type, which differs from the first conductivity type. Generating in the semiconductor substrate a semiconductor area bordering on the first barrier area, the semiconductor area being an intrinsic semiconductor area, or having the first conductivity type and a dopant concentration which is lower than the dopant concentration of the first or second barrier area. Generating in the semiconductor substrate a second barrier area bordering on the semiconductor area, the second barrier area having the first conductivity type and a higher dopant concentration that the semiconductor area. Generating in the semiconductor substrate an anode area bordering on the second barrier area, the anode area having the first conductivity type. Wherein the doping is performed in a manner that the dopant concentration of the first barrier area and the dopant concentration of the second barrier area are such that the first barrier area and the second barrier are more than 95% or fully depleted when no bias voltage is applied to the diode structure.

A further method of producing an electrostatic discharge (ESD) protection device, e.g., according to FIG. 8A or 8B, comprises the following steps.

Providing a semiconductor substrate. Generating in or on the semiconductor substrate a circuit adapted to provide a fixed voltage of first polarity at an output thereof when a voltage of a second polarity that is inverse to the first polarity is applied to an input thereof. Generating in the semiconductor substrate a collector area having a first conductivity type. Generating in the semiconductor substrate a first barrier area bordering on the collector area, the first barrier area having a second conductivity type. Generating in the semiconductor substrate a semiconductor area bordering on the first barrier area, the semiconductor area being an intrinsic semiconductor area, or a semiconductor area having the first or the second conductivity type and a dopant concentration which is lower than a dopant concentration of the first barrier area. Generating in the semiconductor substrate a second barrier area bordering on the semiconductor area, the second barrier area having the second conductivity type and a higher dopant concentration than the semiconductor area. Generating in the semiconductor substrate an emitter area bordering on the second barrier area, the emitter area having the first conductivity type. Generating in the semiconductor substrate a third barrier area bordering on the semiconductor area, the third barrier area having the first conductivity type and a higher dopant concentration than the semiconductor area. Generating in the semiconductor substrate a base area bordering on the third barrier area, the base area having the second conductivity type. The doping is performed in a manner that the dopant concentration of the first barrier area, the second barrier area and the third barrier area are defined such that the first barrier area, the second barrier area and the third barrier area are less than 60% depleted when no voltage is applied to the electrostatic protection device, and more than 95% or fully depleted of their respective majority charge carriers, when the fixed negative voltage is applied to the base area by electrically connecting the output of the circuit with the base area.

A further method of producing an electrostatic discharge (ESD) protection device, for example, according to FIGS. 10A and 10B, comprises the following steps.

Providing a semiconductor substrate. Generating in the semiconductor substrate a collector area having a first conductivity type. Generating an emitter area having the first conductivity type. Generating a barrier area bordering on the emitter area, the barrier area having a second conductivity type that is different from the first conductivity type. Generating in the semiconductor substrate a semiconductor area bordering on the barrier area and the collector area, the semiconductor area being an intrinsic semiconductor area or a semiconductor area having the first or second conductivity type and a dopant concentration which is lower than the dopant concentration of the barrier area. Wherein the doping of the barrier area and the semiconductor area is performed in a manner that the dopant concentration of the barrier area and the semiconductor area are such that the barrier area is 20% to 80% depleted of charge carriers of the second conductivity type, when no voltage is applied to the electrostatic discharge protection element.

The aforegoing was particularly shown and described with reference to the particular embodiments thereof. It is to be understood by those skilled in the art that various other changes in the form and details may be made, without departing from the spirit and scope thereof. It is, therefore, to be understood that various changes may be made in adapting the different embodiments without departing from the broader concept disclosed herein and comprehended by the claims that follow.

What is claimed is:

1. An electrostatic discharge (ESD) protection element comprising:
  a collector area having a first conductivity type;
  a first barrier area bordering on the collector area, the first barrier area having a second conductivity type;
  a semiconductor area bordering on the first barrier area, the semiconductor area being an intrinsic semiconductor area, or a semiconductor area having the first or second conductivity type and a dopant concentration that is lower than a dopant concentration of the first barrier area;
  a second barrier area bordering on the semiconductor area, the second barrier area having the second conductivity type and a higher dopant concentration than the semiconductor area; and an emitter area bordering on the second barrier area, the emitter area having the first conductivity type;
a third barrier area bordering on the semiconductor area, the third barrier area having the first conductivity type and a higher dopant concentration than the semiconductor area; and
a base area bordering on the third barrier area, the base area having the second conductivity type,
wherein the dopant concentration of the third barrier area is such that the third barrier area is more than 95% or fully depleted of charge carriers of the first conductivity type when no voltage is applied to the electrostatic discharge protection element,
wherein the dopant concentrations of the first barrier area and of the second barrier area are such that the first barrier area and the second barrier area are more than 95% depleted of charge carriers of the second conductivity type when no voltage is applied to the electrostatic discharge protection element; and
wherein the base area is connected to the emitter area via an electrical connection line.

2. The electrostatic discharge protection element according to claim 1, wherein the dopant concentration of the first barrier area and the dopant concentration of the second barrier area are such that the first barrier area and the second barrier area are fully depleted of charge carriers of the second conductivity type when no voltage is applied to the electrostatic discharge protection element.

3. The electrostatic discharge protection element according to claim 1, wherein the collector area, the first barrier area, the semiconductor area, the second barrier area and the emitter area comprise a semiconductor material that has a higher bandgap than silicon.

4. The electrostatic discharge protection element according to claim 3, wherein the collector area, the first barrier area, the semiconductor area, the second barrier area and the emitter area comprise silicon carbide (SiC), gallium arsenide (GaAs), gallium nitride (GaN) or diamond as the semiconductor material.

5. The electrostatic discharge protection element according to claim 1, wherein a material with the first conductivity type is an n-doped semiconductor material and a material with the second conductivity is a p-doped semiconductor material.

6. The electrostatic discharge protection element according to claim 1, wherein the electrostatic discharge protection element is a passive electrostatic discharge protection element having only two contacts as external contacts, a data line contact connected to the collector area to connect the collector area with a data line that is to be protected from the electrostatic discharge, and a second contact connected to the emitter area to connect the emitter area with a ground contact.

7. An electrostatic discharge (ESD) protection element comprising:
a collector area having a first conductivity type;
a first barrier area bordering on the collector area, the first barrier area having a second conductivity type;
a semiconductor area bordering on the first barrier area, the semiconductor area being an intrinsic semiconductor area, or a semiconductor area having the first or second conductivity type and a dopant concentration that is lower than a dopant concentration of the first barrier area;
a second barrier area bordering on the semiconductor area, the second barrier area having the second conductivity type and a higher dopant concentration than the semiconductor area; and
an emitter area bordering on the second barrier area, the emitter area having the first conductivity type;
wherein the dopant concentrations of the first barrier area and of the second barrier area are such that the first barrier area and the second barrier area are more than 95% depleted of charge carriers of the second conductivity type when no voltage is applied to the electrostatic discharge protection element;
wherein the semiconductor area is an epitaxy layer bordering on a substrate layer, the substrate layer having the first or second conductivity type and a dopant concentration that is higher than the dopant concentration of the epitaxy layer;
wherein the electrostatic discharge protection element further comprises a barrier layer arranged between the epitaxy layer and the substrate layer, the barrier layer having the first conductivity type and a higher dopant concentration than the semiconductor area; and
wherein the dopant concentration of the barrier layer is such that the barrier layer is depleted more than 95% or fully depleted when no voltage is applied to the electrostatic discharge protection element.

8. A passive chip comprising:
a ground contact to connect the chip with an external ground voltage;
a data line contact to connect the chip with an external data line; and
an electrostatic discharge (ESD) protection element, the electrostatic discharge protection element comprising
a collector area having a first conductivity type;
a first barrier area bordering on the collector area, the first barrier area having a second conductivity type;
a semiconductor area bordering on the first barrier area, the semiconductor area being an intrinsic semiconductor area, or having the first or second conductivity type and a dopant concentration that is lower than a dopant concentration of the first barrier area;
a second barrier area bordering on the semiconductor area, the second barrier area having the second conductivity type and a higher dopant concentration than the semiconductor area; and
an emitter area bordering on the second barrier area, the emitter area having the first conductivity type,
wherein the dopant concentration of the first barrier area and of the second barrier area are such that the first barrier area and the second barrier area are more than 95% depleted or fully depleted of charge carriers of the second conductivity type, when no voltage is applied to the electrostatic discharge protection element; and
wherein the ground contact is connected to the emitter area and the data line contact is connected to the collector area.

9. The passive chip according to claim 8, the passive chip being an electrostatic discharge protection chip, which has only the ground contact and the data line contact as external contacts.

10. The passive chip according to claim 8, comprising:
a plurality of data line contacts to connect the chip with a plurality of external data lines; and
a plurality of electrostatic discharge (ESD) protection elements, each of the electrostatic discharge protection elements comprising:
a collector area having a first conductivity type;
a first barrier area bordering on the collector area, the first barrier area having a second conductivity type;

a semiconductor area bordering on the first barrier area, the semiconductor area being an intrinsic semiconductor area, or having the first or second conductivity type and a dopant concentration that is lower than a dopant concentration of the first barrier area;

a second barrier area bordering on the semiconductor area, the second barrier area having the second conductivity type and a higher dopant concentration than the semiconductor area; and an emitter area bordering on the second barrier area, the emitter area having the first conductivity type, wherein the dopant concentration of the first barrier area and of the second barrier area are such that the first barrier area and the second barrier area are more than 95% depleted or fully depleted of charge carriers of the second conductivity type, when no voltage is applied to the electrostatic discharge protection element;

wherein the first and second conductivity types can differ between different electrostatic discharge protection elements of the plurality of discharge protection elements; and wherein the ground contact is connected to the plurality of emitter areas, and each data line contact of the plurality of data line contacts is connected to a different collector area of the plurality of collector areas.

11. The passive chip according to claim 10, the passive chip being a passive electrostatic discharge protection chip, which has only the ground contact and the plurality of data line contacts as external contacts.

12. An electrostatic discharge protection element comprising a diode structure, the diode structure comprising:

a cathode area having a first conductivity type;

a first barrier area bordering on the cathode area, the first barrier area having a second conductivity type, that differs from the first conductivity type;

a semiconductor area bordering on the first barrier area, the semiconductor area being an intrinsic semiconductor area, or having the first or second conductivity type and a dopant concentration that is lower than a dopant concentration of the first barrier area;

a second barrier area bordering on the semiconductor area, the second barrier area having the first conductivity type and a higher dopant concentration than the semiconductor area; and an anode area bordering on the second barrier area, the anode area having the second conductivity type, wherein the dopant concentration of the first barrier area and the dopant concentration of the second barrier area are such that the first barrier area and the second barrier are more than 95% or fully depleted when no bias voltage is applied to the diode structure;

wherein the electrostatic discharge protection element comprises a further diode structure, the further diode structure comprising:

a further cathode area having the first conductivity type;

a further first barrier area bordering on the further cathode area, the further first barrier area having the second conductivity type;

a further semiconductor area bordering on the further first barrier area, the further semiconductor area being an intrinsic semiconductor area, or having the first or second conductivity type and a dopant concentration that is lower than a dopant concentration of the further first barrier area;

a further second barrier area bordering on the further semiconductor area, the further second barrier area having the first conductivity type and a higher dopant concentration than the further semiconductor area; and a further anode area bordering on the further second barrier area, the further anode area having the second conductivity type, wherein both the cathode area and the further anode area are connected to a data line contact of the electrostatic discharge protection element and wherein both the anode area and the further cathode area are connected to a ground contact of the electrostatic discharge protection element.

13. The electrostatic discharge protection element according to claim 12, wherein a forward breakdown voltage of the diode structure and a forward breakdown voltage of the further diode structure are smaller than reverse breakdown voltages of the diode structure and the further diode structure.

14. A method of producing an electrostatic discharge (ESD) protection element on a passive chip, the method comprising:

forming in a semiconductor substrate a collector area having a first conductivity type;

forming in the semiconductor substrate a first barrier area bordering on the collector area, the first barrier area having a second conductivity type;

forming in the semiconductor substrate a semiconductor area bordering on the first barrier area, the semiconductor area being an intrinsic semiconductor area, or a semiconductor area having the first or second conductivity type and a dopant concentration that is lower than a dopant concentration of the first barrier area;

forming in the semiconductor substrate a second barrier area bordering on the semiconductor area, the second barrier area having the second conductivity type and a higher dopant concentration than the semiconductor area; and forming in the semiconductor substrate an emitter area bordering on the second barrier area, the emitter area having the first conductivity type;

forming a ground contact at the semiconductor substrate for connecting the chip with an external ground voltage, wherein the ground contact is electrically connected with the emitter area; and forming a data line contact at the semiconductor substrate for connecting the chip with an external data line, wherein the data line contact is electrically connected with the collector area;

wherein the dopant concentration of the first barrier area and of the second barrier area are such that the first barrier area and the second barrier area are more than 95% or fully depleted of charge carriers of the second conductivity type, when no voltage is applied to the electrostatic discharge protection element.

15. The method according to claim 14, further comprising:

forming in the semiconductor substrate a third barrier area bordering on the semiconductor area, the third barrier area having the first conductivity type and a higher dopant concentration than the semiconductor area; and forming in the semiconductor substrate a base area bordering on the third barrier area, the base area having the second conductivity type, wherein the dopant concentration of the third barrier area is such that the third barrier area is more than 95% or fully depleted of charge carriers of the first conductivity type, when no voltage is applied to the electrostatic discharge protection element.

16. An electrostatic discharge (ESD) protection element comprising:

a collector area having a first conductivity type;
an emitter area having the first conductivity type;
a barrier area having a second conductivity type; and
a semiconductor area being an intrinsic semiconductor area, or a semiconductor area having the first or second conductivity type and a dopant concentration that is lower than a dopant concentration of the barrier area,
wherein the dopant concentrations of the barrier area and the semiconductor area are such that the barrier area is about 20-80% depleted of charge carriers of the second conductivity type when no voltage is applied to the electrostatic discharge protection element, and
wherein the barrier area borders on the emitter area, and the semiconductor area borders on the collector area and the barrier area, or
wherein the barrier area borders on the collector area, and the semiconductor area borders on the emitter area and the barrier area.

* * * * *